(12) United States Patent
Lee et al.

(10) Patent No.: US 10,573,840 B2
(45) Date of Patent: Feb. 25, 2020

(54) ORGANIC LIGHT EMITTING DIODE AND ORGANIC LIGHT EMITTING DISPLAY PANEL HAVING THE SAME

(71) Applicant: SAMSUNG DISPLAY CO., LTD., Yongin-si, Gyeonggi-do (KR)

(72) Inventors: Minwoo Lee, Suwonsi (KR); Youngmo Koo, Suwonsi (KR); Okkeun Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 276 days.

(21) Appl. No.: 15/455,284

(22) Filed: Mar. 10, 2017

(65) Prior Publication Data

US 2017/0309859 A1 Oct. 26, 2017

(30) Foreign Application Priority Data

Apr. 20, 2016 (KR) .......................... 10-2016-0048351

(51) Int. Cl.
*H01L 51/50* (2006.01)
*H01L 27/32* (2006.01)
*H01L 51/52* (2006.01)

(52) U.S. Cl.
CPC ........ *H01L 51/5076* (2013.01); *H01L 27/322* (2013.01); *H01L 27/3218* (2013.01); *H01L 27/3248* (2013.01); *H01L 51/504* (2013.01); *H01L 51/524* (2013.01); *H01L 51/5218* (2013.01); *H01L 51/5234* (2013.01);
(Continued)

(58) Field of Classification Search
CPC .. H01L 51/5076; H01L 51/506; H01L 51/504
See application file for complete search history.

(56) References Cited

U.S. PATENT DOCUMENTS

2006/0261333 A1  11/2006  Murakami et al.
2015/0200379 A1   7/2015  Kim
(Continued)

FOREIGN PATENT DOCUMENTS

EP         2 999 019 A1    3/2016
KR    10-2010-0019153 A    2/2010
KR       10-1097336 B1    12/2011
(Continued)

OTHER PUBLICATIONS

Kihyon Hong,et al., Optical Properties of WO3/Ag/WO3 Multilayer As Transparent Cathode in Top-Emitting Organic Light Emitting Diodes, The Journal of Physical Chemistry, Feb. 3, 2011.

*Primary Examiner* — Jose R Diaz
(74) *Attorney, Agent, or Firm* — Lewis Roca Rothgerber Christie LLP

(57) ABSTRACT

An organic light emitting diode and an organic light emitting display panel, the organic light emitting diode including an anode disposed on a base layer; a first organic light emitting layer disposed on the anode; a cathode disposed on the first organic light emitting layer; and an electron control layer disposed between the first organic light emitting layer and the cathode, the electron control layer including ytterbium, wherein the cathode includes a first inorganic compound layer contacting the electron control layer to form a P-N junction with the electron control layer; and a conductive layer disposed on the first inorganic compound layer.

37 Claims, 22 Drawing Sheets

(52) U.S. Cl.
CPC ...... *H01L 51/5253* (2013.01); *H01L 51/5281* (2013.01); *H01L 2251/305* (2013.01)

(56) References Cited

U.S. PATENT DOCUMENTS

2017/0162818 A1\* 6/2017 Kijima ................ H01L 51/5012
2018/0366676 A1\* 12/2018 Seo ....................... H01L 51/504

FOREIGN PATENT DOCUMENTS

| KR | 10-1128214 B1 | 3/2012 |
| KR | 10-2012-0068746 A | 6/2012 |
| KR | 10-2014-0078391 A | 6/2014 |
| KR | 10-2015-0044402 A | 4/2015 |
| KR | 10-2015-0060058 A | 6/2015 |
| KR | 10-2015-0063601 A | 6/2015 |

\* cited by examiner

ORGANIC LIGHT EMITTING DIODE AND ORGANIC LIGHT EMITTING DISPLAY PANEL HAVING THE SAME

CROSS-REFERENCE TO RELATED APPLICATION

Korean Patent Application No. 10-2016-0048351, filed on Apr. 20, 2016, in the Korean Intellectual Property Office, and entitled: "Organic Light Emitting Diode and Organic Light Emitting Display Panel Having the Same," is incorporated by reference herein in its entirety.

BACKGROUND

1. Field

Embodiments relate to an organic light emitting diode and an organic light emitting display panel having the same.

2. Description of the Related Art

An organic light emitting diode, which is a self-emissive device, has advantages such as a wide viewing angle and a superior contrast. The organic light emitting diode has a fast response time as well.

An organic light emitting diode may include an anode, functional organic layers sequentially stacked on the anode, and a cathode. The functional organic layers may include a hole injection/transport layer, a light emitting layer, and an electron injection/transport layer.

The operation of the organic light emitting diode is based on the following principle. When voltages that are different from each other are respectively applied to the anode and the cathode, holes injected from the anode move to the light emitting layer via the hole transport layer, and electrons injected from the cathode move to the light emitting layer via the electron transport layer. The electrons are recombined with the holes in the light emitting layer to generate excitons. The organic light emitting diode emits a light by the excitons that return to a ground state from an excited state.

SUMMARY

Embodiments are directed to an organic light emitting diode and an organic light emitting display panel having the same.

The embodiments may be realized by providing an organic light emitting diode including an anode disposed on a base layer; a first organic light emitting layer disposed on the anode; a cathode disposed on the first organic light emitting layer; and an electron control layer disposed between the first organic light emitting layer and the cathode, the electron control layer including ytterbium, wherein the cathode includes a first inorganic compound layer contacting the electron control layer to form a P-N junction with the electron control layer; and a conductive layer disposed on the first inorganic compound layer.

The first inorganic compound layer may be a tungsten oxide layer or a molybdenum oxide layer.

The electron control layer may further include an electron transport material, and the electron transport material may be doped with ytterbium.

The electron control layer may include about 1 wt % to about 10 wt % of ytterbium, based on a total weight of the electron control layer.

The conductive layer may be a metal-containing layer.

The cathode may further include a second inorganic compound layer disposed on the conductive layer, the second inorganic compound layer having a same refractive index as the first inorganic compound layer.

The conductive layer may be a transparent conductive oxide layer.

The electron control layer may include an ytterbium layer, and the conductive layer may be a transparent conductive oxide layer.

The organic light emitting diode may further include a diffusion blocking layer disposed between the electron control layer and the first organic light emitting layer.

The organic light emitting diode may further include a reflection layer disposed between the base layer and the anode, wherein the anode is a transparent conductive layer.

The anode may include at least one of a reflection layer or a transparent conductive oxide layer.

The organic light emitting diode may further include a second organic light emitting layer disposed between the cathode and the first organic light emitting layer.

The first organic light emitting layer may include a first organic light emitting material to generate a light having a first wavelength range, the second organic light emitting layer may include a second organic light emitting material to generate a light having a second wavelength range that is different from the first wavelength range, one light of the light having the first wavelength range and the light having the second wavelength range may be a blue light, and the other light of the light having the first wavelength range and the light having the second wavelength range may be a yellow light.

The first organic light emitting layer may include a first organic light emitting material to generate a light having a first wavelength range, and the second organic light emitting layer may include a second organic light emitting material to generate a light having a second wavelength range different from the first wavelength range, and a third organic light emitting material to generate a light having a third wavelength range different from the first wavelength range and the second wavelength range.

The organic light emitting diode may further include an electric charge generating layer disposed between the first organic light emitting layer and the second organic light emitting layer.

The organic light emitting diode may further include a third organic light emitting layer disposed between the cathode and the second organic light emitting layer.

The first organic light emitting layer may include a first organic light emitting material to generate a light having a first wavelength range, the second organic light emitting layer may include a second organic light emitting material to generate a light having a second wavelength range different from the first wavelength range, and the third organic light emitting layer may include a third organic light emitting material to generate a light having a third wavelength range different from the first wavelength range and the second wavelength range.

The organic light emitting diode may further include at least one of a first electric charge generating layer disposed between the first organic light emitting layer and the second organic light emitting layer and a second electric charge generating layer disposed between the second organic light emitting layer and the third organic light emitting layer.

The embodiments may be realized by providing an organic light emitting display panel including a base substrate; a circuit layer disposed on the base substrate, the circuit layer including a plurality of pixel driving circuits; a plurality of organic light emitting diodes disposed on the circuit layer, the plurality of organic light emitting diodes being electrically connected to the pixel driving circuits, respectively; and a plurality of color filters disposed on the organic light emitting diodes, wherein each of the organic light emitting diodes includes an anode; a first organic light emitting layer disposed on the anode; a second organic light emitting layer disposed on the first organic light emitting layer; a cathode disposed on the second organic light emitting layer; and an electron control layer disposed between the second organic light emitting layer and the cathode, the electron control layer including ytterbium, wherein the cathode includes a first inorganic compound layer contacting the electron control layer to form a P-N junction with the electron control layer; and a conductive layer disposed on the first inorganic compound layer.

The organic light emitting display panel may further include a thin film encapsulation layer to encapsulate the organic light emitting diodes, wherein the color filters are disposed on the thin film encapsulation layer.

The organic light emitting display panel may further include a sealing substrate facing the base substrate and sealing the organic light emitting diodes, wherein the color filters are disposed on a lower surface of the sealing substrate.

Each of the organic light emitting diodes may generate a white light.

The color filters may include a first color filter having a first color, a second color filter having a second color different from the first color, and a third color filter having a third color different from the first color and the second color.

The color filters may further include a gray color filter to decrease a brightness of an incident light.

The organic light emitting display panel may further include a third organic light emitting layer disposed between the cathode and the first organic light emitting layer.

The first inorganic compound layer may be a tungsten oxide layer or a molybdenum oxide layer.

The electron control layer may further include an electron transport material, and the electron transport material may be doped with the ytterbium.

The electron control layer may include about 1 wt % to about 10 wt % of ytterbium, based on a total weight of the electron control layer.

The conductive layer may be a metal-containing layer.

The cathode may further include a second inorganic compound layer disposed on the conductive layer, the second inorganic compound layer having a same refractive index as the first inorganic compound layer.

The conductive layer may be a transparent conductive oxide layer.

The electron control layer may include an ytterbium layer, and the conductive layer may be a transparent conductive oxide layer.

The embodiments may be realized by providing an organic light emitting diode including an anode; an organic light emitting layer on the anode; an electron control layer on the organic light emitting layer, the electron control layer including ytterbium; and a cathode on the electron control layer; wherein the cathode includes a first inorganic compound layer contacting the electron control layer to form a P-N junction with the electron control layer; and a conductive layer on the first inorganic compound layer such that the first inorganic compound layer is between the electron control layer and the conductive layer.

The cathode may further include a second inorganic compound layer on the conductive layer such that the conductive layer is between the second inorganic compound layer and the first inorganic compound layer, the second inorganic compound layer having a same refractive index as the first inorganic compound layer.

The first inorganic compound layer may include tungsten oxide or molybdenum oxide.

The conductive layer may include a transparent conductive oxide.

The electron control layer may include about 1 wt % to about 10 wt % of ytterbium, based on a total weight of the electron control layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
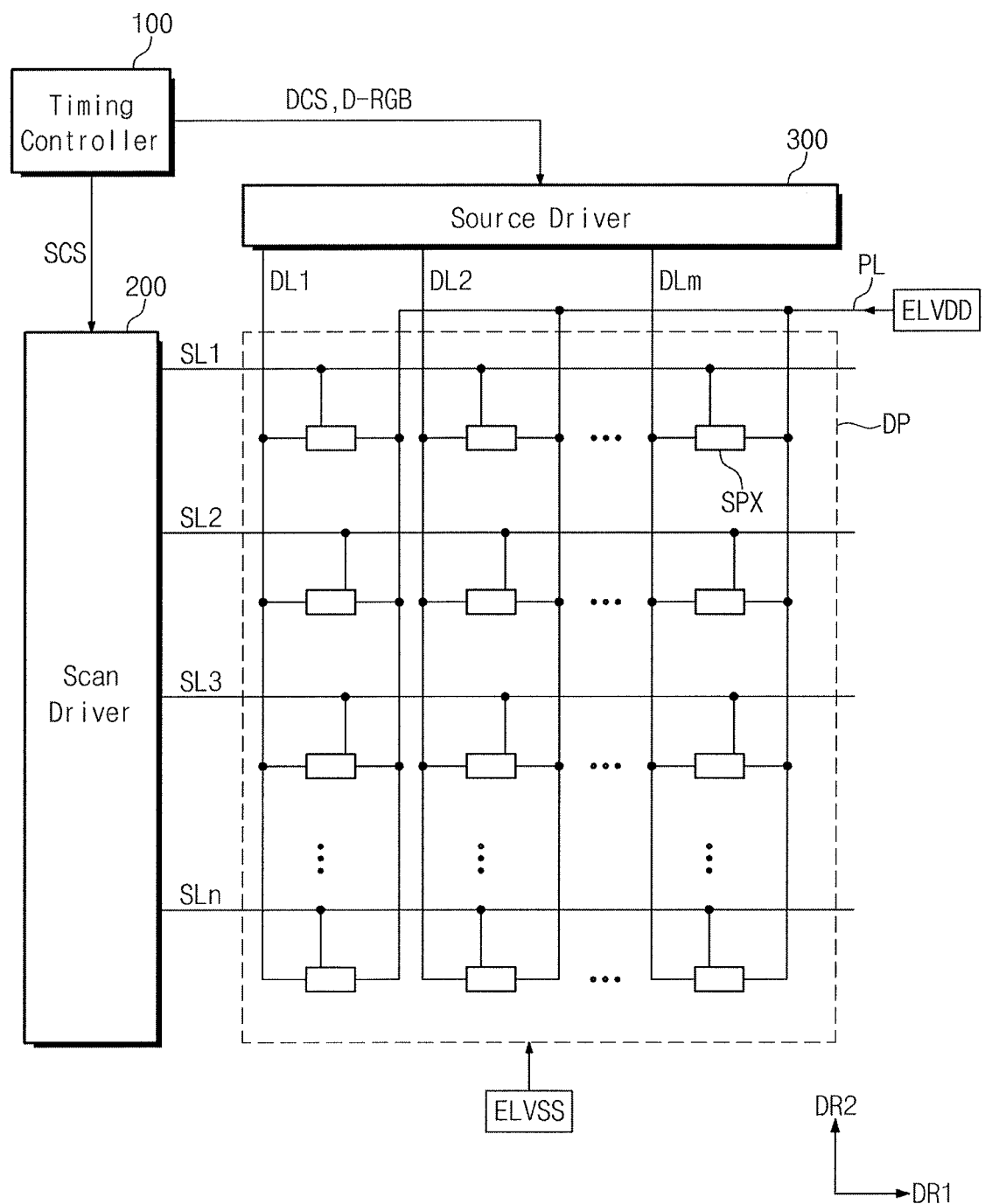
FIG. 1 illustrates a block diagram showing an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
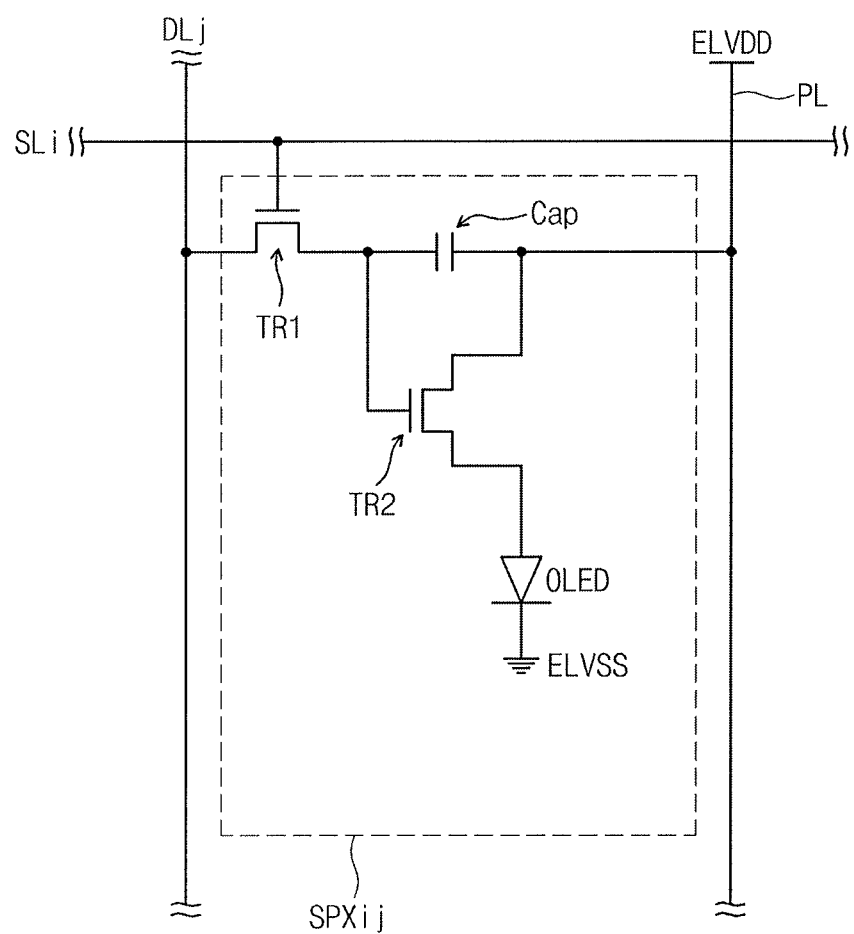
FIG. 2 illustrates a circuit diagram showing a sub-pixel according to an exemplary embodiment.

FIG. 1 illustrates a block diagram showing an organic light emitting display device according to an exemplary embodiment. FIG. 2 illustrates a circuit diagram showing a sub-pixel SPXij according to an exemplary embodiment. Hereinafter, the organic light emitting display device will be described with reference to FIGS. 1 and 2.

Referring to FIG. 1, the organic light emitting display device may include, e.g., a timing controller 100, a scan driver 200, a source driver 300, and an organic light emitting display panel DP. In an implementation, the organic light emitting display device may further include an additional driver in addition to the scan driver 200 and the source driver 300.

The timing controller 100 may receive input image signals and may convert a data format of the input image signals to a data format appropriate to an interface between the timing controller and the source driver 300 to generate image data D-RGB. The timing controller 100 may output the image data D-RGB and various control signals DCS and SCS.

The scan driver 200 may receive a scan control signal SCS from the timing controller 100. The scan control signal SCS may include a vertical start signal starting an operation of the scan driver 200, a clock signal determining an output timing of signals, etc. The scan driver 200 may generate gate signals in response to the scan control signal SCS and may sequentially apply the gate signals to scan lines SL1 to SLn described below.

As illustrated in FIG. 1, the gate signals may be output from one scan driver 200. In an implementation, the organic light emitting display device may include a plurality of scan drivers. The scan drivers may output gate signals different from each other.

The source driver 300 may receive a data control signal DCS and the image data D-RGB from the timing controller 100. The source driver 300 may convert the image data D-RGB to data signals and applies the data signals to source lines DL1 to DLm described below. The data signals may be analog voltages respectively corresponding to grayscale values of the image data D-RGB.

The organic light emitting display panel DP may include the scan lines SL1 to SLn, the source lines DL1 to DLm, and sub-pixels SPX. The scan lines SL1 to SLn may extend in a first direction axis DR1 and are arranged in a second direction axis DR2 substantially perpendicular to the first direction axis DR1. The source lines DL1 to DLm may be insulated from the scan lines SL1 to SLn while crossing the scan lines SL1 to SLn. In an implementation, the organic light emitting display panel DP may further include signal lines transmitting signals different from the gate signals and the data signals to the sub-pixels SPX in consideration of a circuit configuration of the sub-pixels SPX.

Each of the sub-pixels SPX may be connected to a corresponding scan line among the scan lines SL1 to SLn and a corresponding source line among the source lines DL1 to DLm. Each of the sub-pixels SPX may receive a first voltage ELVDD and a second voltage ELVSS having a voltage level lower than that of the first voltage ELVDD. Each of the sub-pixels SPX is connected to a power line PL to which the first voltage ELVDD is applied.

FIG. 2 shows an example of an equivalent circuit of one sub-pixel SPXij connected to an i-th scan line SLi and a j-th source line DLj. Although not shown in figures, the other sub-pixels SPX shown in FIG. 1 may have the same equivalent circuit as that of the sub-pixel SPXij.

Referring to FIG. 2, the sub-pixel SPXij may include at least one transistor, at least one capacitor Cap, and an organic light emitting diode OLED. In an implementation, as shown in FIG. 2, a pixel driving circuit may include two transistors TR1 and TR2 and one capacitor Cap.

A first transistor TR1 may output a data signal provided through the j-th source line DLj in response to a gate signal provided through the i-th scan line SL1. The capacitor Cap may be charged with a voltage corresponding to the data signal provided from the first transistor TR1. A second transistor TR2 may control a driving current flowing through the organic light emitting diode OLED in response to the voltage charged in the capacitor Cap.

Figure 3:
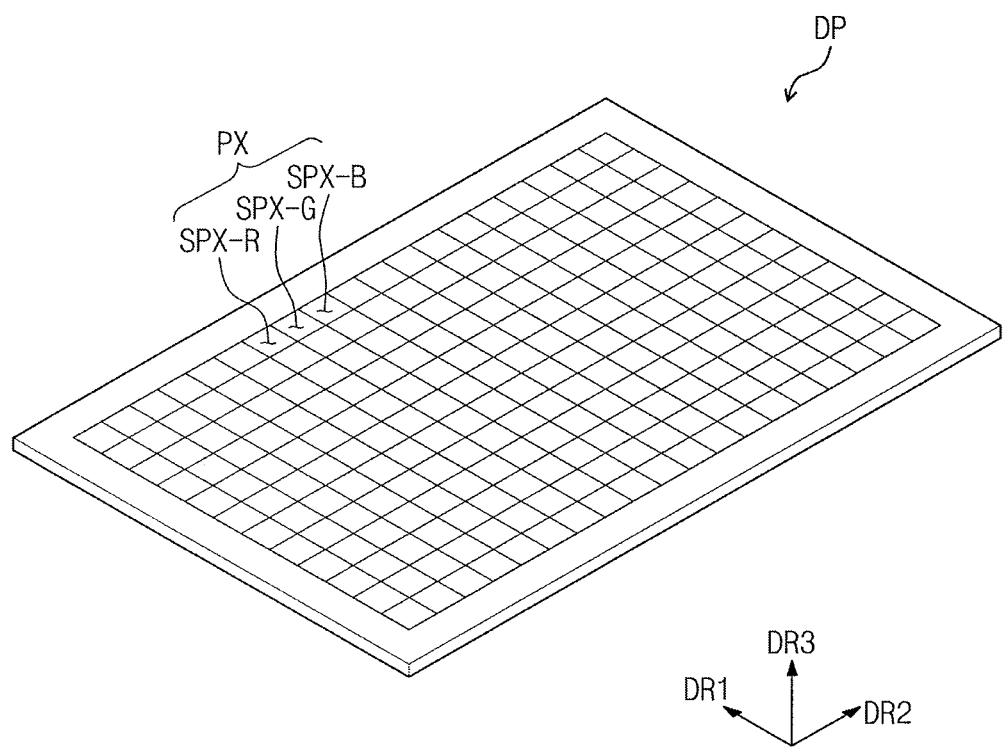
FIG. 3 illustrates a perspective view showing an organic light emitting display panel according to an exemplary embodiment.

FIG. 3 illustrates a perspective view showing the organic light emitting display panel DP according to an exemplary embodiment. FIGS. 4A to 4E illustrate plan views showing organic light emitting display panels according to an exemplary embodiment. FIGS. 4A to 4E show a portion of the organic light emitting display panels when viewed in a plan view.

Referring to FIG. 3, the organic light emitting display panel DP may include a plurality of sub-pixels SPX-R, SPX-G, and SPX-B. Three types of sub-pixels SPX-R, SPX-G, and SPX-B are shown as an example, and the three types of sub-pixels SPX-R, SPX-G, and SPX-B may emit lights having different colors from each other. For example, the three types of sub-pixels SPX-R, SPX-G, and SPX-B may emit a red light, a green light, and a blue light, respectively. In an implementation, the three types of sub-pixels SPX-R, SPX-G, and SPX-B may emit a magenta light, a yellow light, and a cyan light, respectively. The three types of sub-pixels SPX-R, SPX-G, and SPX-B may emit the lights in a third direction axis DR3 shown in FIG. 3.

A combination of sub-pixels SPX-R, SPX-G, and SPX-B emitting lights having different colors from each other may be defined as a pixel PX. As shown in FIG. 3, the pixel PX may include the three types of sub-pixels SPX-R, SPX-G, and SPX-B. In an implementation, the pixel PX may include four types of sub-pixels, and the four types of sub-pixels may emit a red light, a green light, a blue light, and a white light, respectively.

Figure 4A:
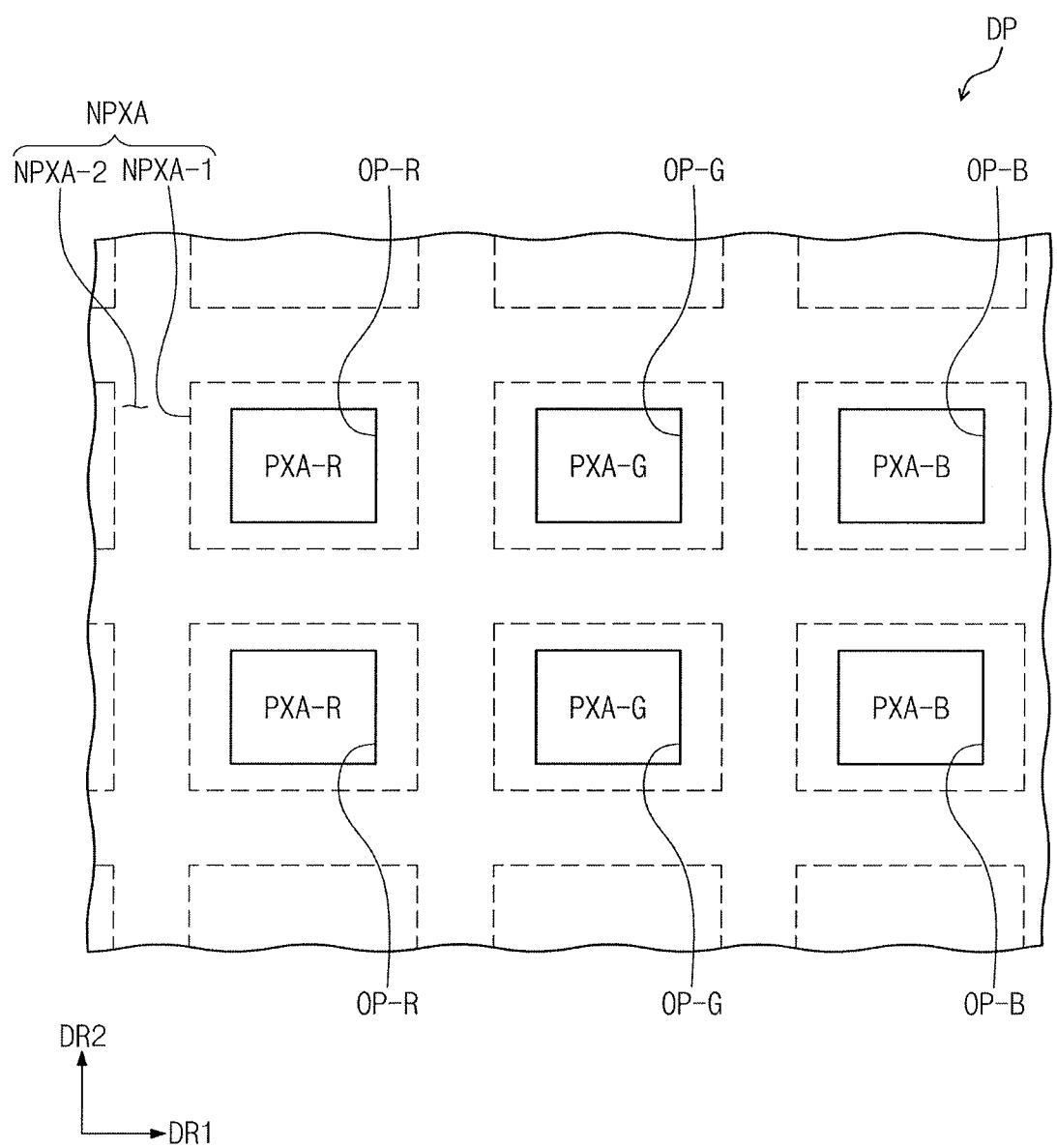
FIGS. 4A to 4E illustrate plan views showing the organic light emitting display panel according to an exemplary embodiment.

Referring to FIG. 4A, the organic light emitting display panel DP may be divided into a plurality of light emitting areas PXA-R, PXA-G, and PXA-B and a non-light emitting area NPXA on a plane surface defined by the first direction axis DR1 and the second direction axis DR2. FIG. 4A shows three types of light emitting areas PXA-R, PXA-G, and PXA-B arranged in a matrix configuration as a representative example. In the three types of light emitting areas PXA-R, PXA-G, and PXA-B, the organic light emitting diodes of the three types of sub-pixels SPX-R, SPX-G, and SPX-B may be respectively disposed.

The non-light emitting area NPXA may be divided into first non-light emitting areas NPXA-1 surrounding the light emitting areas PXA-R, PXA-G, and PXA-B and a second non-light emitting area NPXA-2 disposed between the first non-light emitting areas NPXA-1. The signal lines, e.g., the scan line SLi (refer to FIG. 2), the source line DLj (refer to FIG. 2), and power line PL (refer to FIG. 2), may be arranged in the second non-light emitting area NPXA-2. A driving circuit of a corresponding sub-pixel, such as the transistors TR1 and TR2 (refer to FIG. 2) or the capacitor Cap (refer to FIG. 2), may be arranged in each of the first non-light emitting areas NPXA-1. In an implementation, the non-light emitting area NPXA may not be divided into the first non-light emitting areas NPXA-1 and the second non-light emitting area NPXA-2.

Figure 4B:
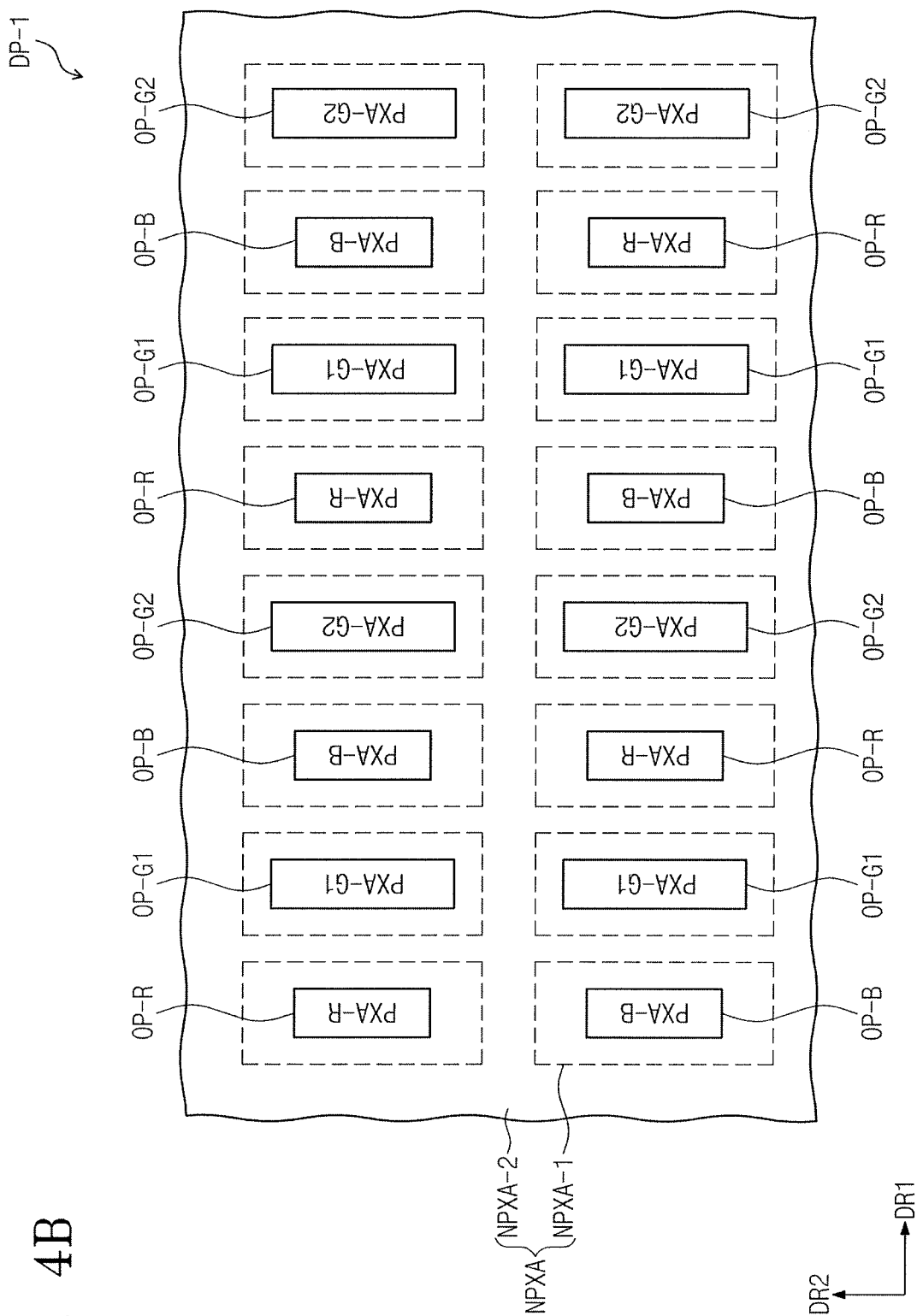
Figure 4C:
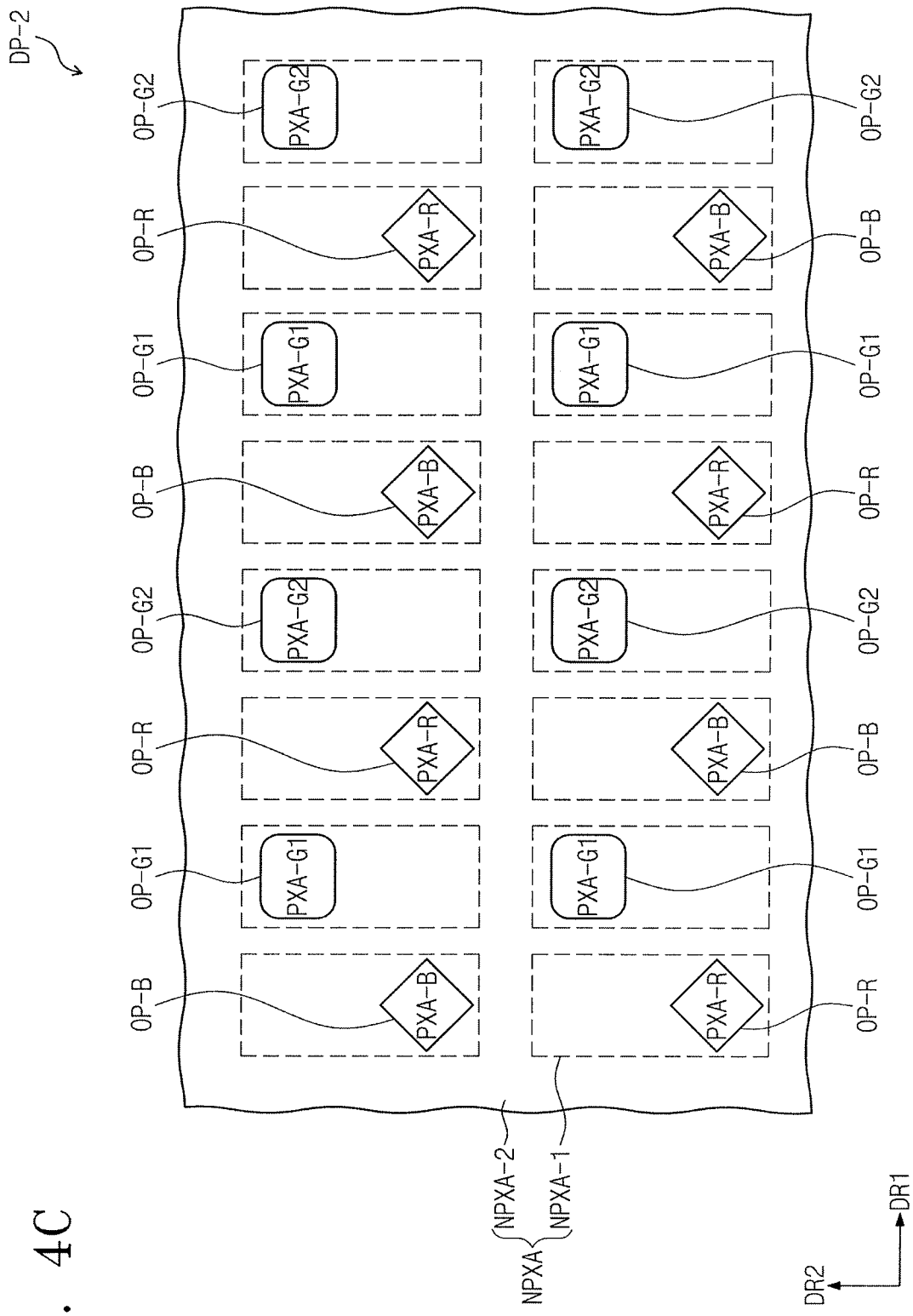

FIGS. 4B to 4E illustrate plan views showing organic light emitting display panels DP-1, DP-2, DP-3, and DP-4 having a different arrangement of the sub-pixel from the sub-pixels arranged in a stripe pattern shown in FIG. 4A. Referring to FIGS. 4B and 4C, four light emitting areas PXA-R, PXA-G1, PXA-B, and PXA-G2 may be repeatedly arranged. Organic light emitting diodes of the sub-pixels may be respectively disposed in the four light emitting areas PXA-R, PXA-G1, PXA-B, and PXA-G2. A position of a blue light emitting area PXA-B and a position of a red light emitting area PXA-R may be changed with respect to each other every pixel row. Among the four light emitting areas PXA-R, PXA-G1, PXA-B, and PXA-G2, green light emitting areas PXA-G1 and PXA-G2 may have an area or a shape, which are different from those of the blue light emitting area PXA-B or the red light emitting area PXA-R.

Figure 4D:
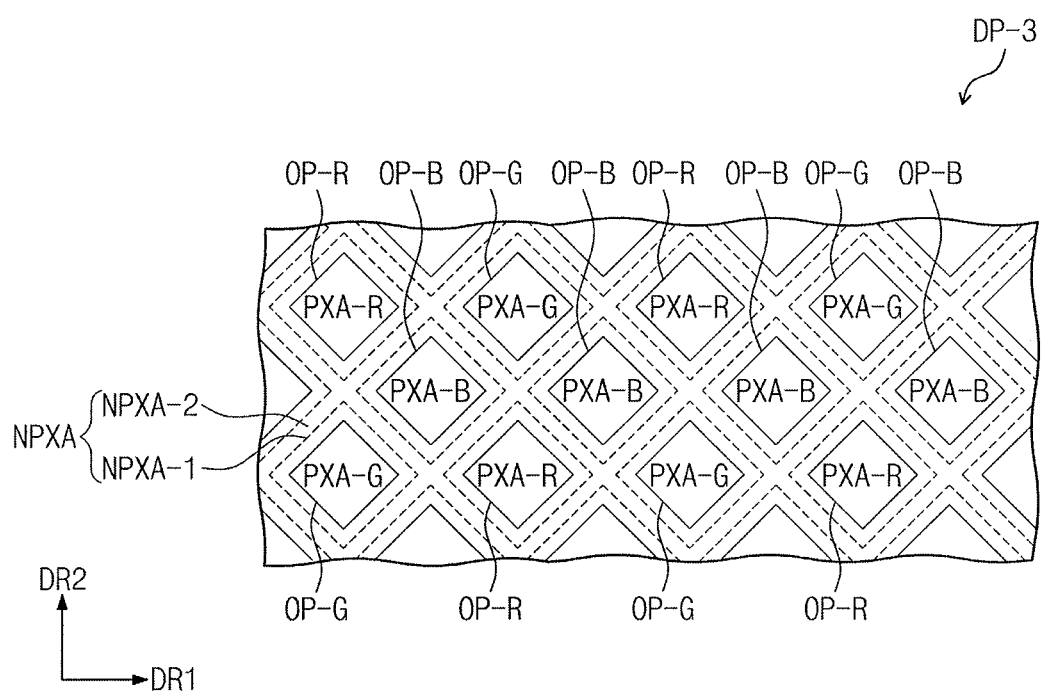
Figure 4E:
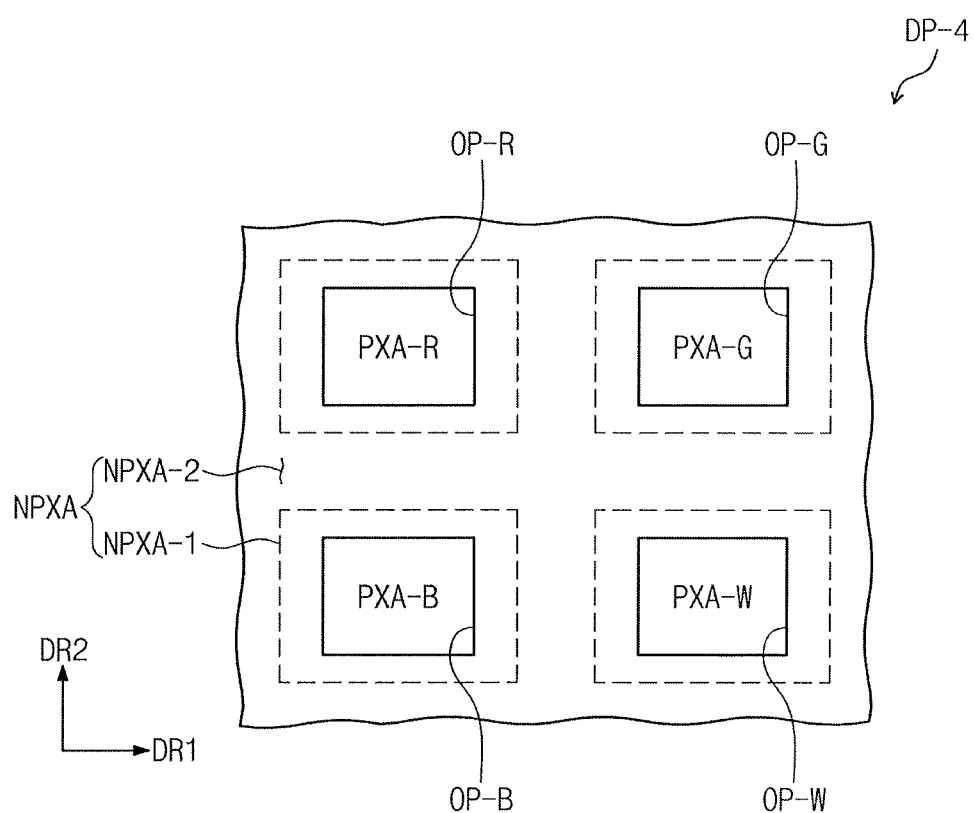

Referring to FIG. 4D, each blue light emitting area PXA-B may be surrounded by two red light emitting areas PXA-R and two green light emitting areas PXA-G. The two red light emitting areas PXA-R may be disposed on a diagonal line, and the two green light emitting areas PXA-G may be disposed on a diagonal line. Referring to FIG. 4E, four light emitting areas PXA-R, PXA-G, PXA-B, and PXA-W may be repeatedly arranged in the organic light emitting display panel DP-4. In the four light emitting areas PXA-R, PXA-G, PXA-B, and PXA-W, organic light emitting diodes may be respectively disposed to emit a red light, a green light, a blue light, and a white light.

In the present disclosure, the expression that "a light having a predetermined color is emitted from a light emitting area" used herein means not only that a light generated from a light emitting diode is emitted as is but also that the light generated from the light emitting diode is emitted after the color of the light is changed.

Figure 5A:
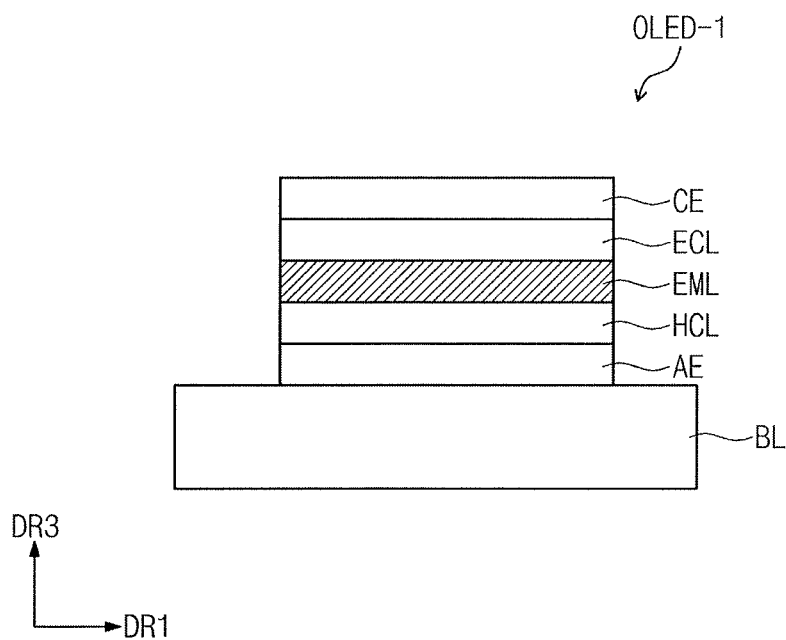
FIG. 5A illustrates a cross-sectional view showing an organic light emitting diode according to an exemplary embodiment.
Figure 5B:
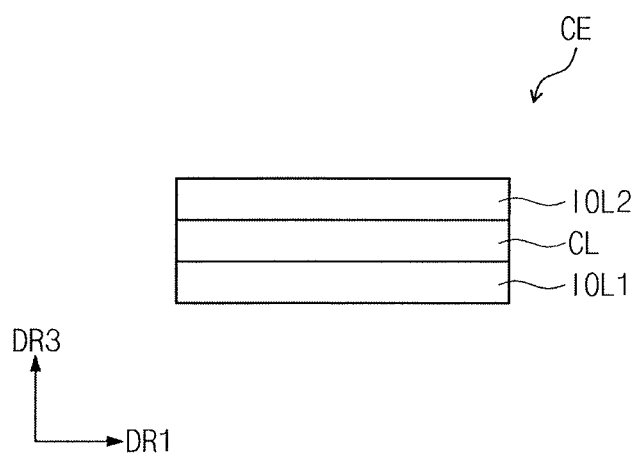
FIG. 5B illustrates a cross-sectional view showing a cathode according to an exemplary embodiment.

FIG. 5A illustrates a cross-sectional view showing an organic light emitting diode OLED-1 according to an exemplary embodiment. FIG. 5B illustrates a cross-sectional view showing a cathode according to an exemplary embodiment. The organic light emitting diode OLED-1 may be disposed in a corresponding light emitting area among the light emitting areas shown in FIGS. 4A to 4E.

The organic light emitting diode OLED-1 may include, e.g., an anode AE disposed on a base layer BL, a hole control layer HCL disposed on the anode AE, an organic light emitting layer EML disposed on the hole control layer HCL, a cathode CE disposed on the organic light emitting layer EML, and an electron control layer ECL disposed between the organic light emitting layer EML and the cathode CE. In an implementation, a functional layer may be further disposed between the anode AE and the cathode CE. The organic light emitting diode according to an exemplary embodiment may include a plurality of organic light emitting layers.

The base layer BL may include, e.g., an organic layer, an inorganic layer, a glass substrate, a metal substrate, or the like. The base layer BL may serve as an insulating layer (an organic layer or an inorganic layer) of the organic light emitting display panel DP (refer to FIG. 3).

The anode AE may be a transmissive electrode, a transflective electrode, or a reflective electrode. In an implementation, the anode AE may be the reflective electrode for a front-surface emission. The anode AE may have a single-layer structure or a multi-layer structure. The single-layer anode AE may include a metal layer having Ag, Mg, Al, Pt, Pd, Au, Ni, Nd, Ir, Cr or a mixture thereof. The multi-layer anode AE may include a metal layer having Ag, Mg, Al, Pt, Pd, Au, Ni, Nd, Ir, Cr or a mixture thereof and a transparent conductive oxide layer including a transparent conductive oxide material. The transparent conductive oxide material may include indium tin oxide (ITO), indium zinc oxide (IZO), zinc oxide (ZnO), indium tin zinc oxide (ITZO), etc. The multi-layer anode AE may have a three-layer structure configured to include a first transparent conductive oxide layer, a metal layer, and a second transparent conductive oxide layer. The multi-layer anode AE may have a two-layer structure configured to include a transparent conductive oxide layer and a metal layer. The metal layer may serve as a reflective electrode.

The hole control layer HCL may include a hole injection/transport material. The hole control layer HCL may include a plurality of functional layers. For example, the hole control layer HCL may include a hole injection layer and a hole transport layer.

The functional layers may include the hole injection layer and the hole transport layer disposed above the hole injection layer in the third direction axis DR3, e.g., the hole injection layer may be between the anode and the hole transport layer. In an implementation, the hole injection layer may include, e.g., a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino) triphenylamine), TDATA (4,4'4"-Tris(N,N-diphenylamino)triphenylamine), 2TNATA (4,4',4"-tris{N,-(2-naphthyl)-N-phenylamino}-triphenylamine), PEDOT/PSS (Poly(3,4-ethylenedioxythiophene)/Poly(4-styrenesulfonate), PANI/DBSA (Polyaniline/Dodecylbenzenesulfonic acid), PANI/CSA (Polyaniline/Camphor sulfonicacid), PANI/PSS ((Polyaniline)/Poly(4-styrenesulfonate), etc.

In an implementation, the hole transport layer may include carbazole-based derivatives, e.g., n-phenyl carbazole, polyvinyl carbazole, etc., fluorine-based derivatives, triphenylamine-based derivatives, e.g., TPD (N,N'-bis(3-methylphenyl)-N,N'-diphenyl-[1,1-biphenyl]-4,4'-diamine), TCTA (4,4',4"-tris(N-carbazolyl)triphenylamine), etc., NPB (N,N'-di(1-naphthyl)-N,N'-diphenylbenzidine), TAPC (4,4'-Cyclohexylidene bis[N,N-bis(4-methylphenyl)benzenamine]), etc.

In an implementation, the hole injection layer may be omitted. In an implementation, the hole control layer may include a hole injection layer doped with a p-type dopant. In this case, the hole transport layer may be omitted from the hole control layer. In an implementation, the hole control layer may further include a doped layer interposed between the hole injection layer and the hole transport layer. A hole generating material, e.g., the p-type dopant, enhances a hole injection efficiency. In an implementation, the hole control layer may further include an electron blocking layer in addition to the hole injection layer and the hole transport layer. The electron blocking layer may help prevent electrons from being injected into the hole control layer from an electron control layer.

The organic light emitting layer EML may include an organic light emitting material. In an implementation, the organic light emitting material may include materials emitting a red light, a green light, or a blue light and a fluorescent material or a phosphorescent material. In an implementation, the organic light emitting layer EML may include two or more light emitting materials.

In an implementation, the organic light emitting layer EML may include a host and a dopant. As the host, e.g., Alq3 (tris(8-hydroxyquinolino)aluminum), CBP (4,4'-bis(N-carbazolyl)-1,1'-biphenyl), PVK (poly(n-vinylcabazole), AND (9,10-di(naphthalene-2-yl)anthracene), TCTA (4,4',4"-Tris (carbazol-9-yl)-triphenylamine), TPBi (1,3,5-tris(N-phenyl-benzimidazole-2-yl)benzene), TBADN (3-tert-butyl-9,10-di (naphth-2-yl)anthracene), DSA (distyrylarylene), CDBP (4,4'-bis(9-carbazolyl)-2,2"-dimethyl-biphenyl), or MADN (2-Methyl-9,10-bis(naphthalen-2-yl)anthracene) may be used.

When the organic light emitting layer EML emits the red light, the organic light emitting layer EML may include a fluorescent material containing PBD:Eu(DBM)3(Phen) (tris (dibenzoylmethanato)phenanthoroline europium) or perylene. When the organic light emitting layer EML emits the red light, the dopant included in the organic light emitting layer EML may be selected from a metal complex, e.g., PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP (octaethylporphyrin platinum), etc., or organometallic complex. In an implementation, the organic light emitting layer EML emitting the red light may include a phosphorescent material, e.g., Btp2Ir(acac).

When the organic light emitting layer EML emits the green light, the organic light emitting layer EML may include a fluorescent material containing Alq3 (tris(8-hydroxyquinolino)aluminum). When the organic light emitting layer EML emits the green light, the dopant included in the organic light emitting layer may be selected from a metal complex, e.g. Ir(ppy)$_3$ (fac-tris(2-phenylpyridine)iridium), or organometallic complex. The organic light emitting layer EML emitting the green light may include a phosphorescent material, e.g., Ir(ppy)$_3$.

When the organic light emitting layer EML emits the blue light, the organic light emitting layer EML may include a fluorescent material including any one of spiro-DPVBi, Spiro-6P, DSB (distyryl-benzene), DSA (distyryl-arylene), PFO (Polyfluorene)-based polymer, and PPV (poly(p-phenylene vinylene)-based polymer. When the light emitting layer EML emits the blue light, the dopant included in the light emitting layer EML may be selected from a metal complex, such as (4,6-F$_2$ppy)$_2$Irpic, or organometallic complex.

The cathode CE may be a transmissive electrode or a transflective electrode. In an implementation, the cathode CE may be the transmissive electrode having a multi-layer structure. As shown in FIG. 5B, the cathode CE may include, e.g., a first inorganic compound layer IOL1, a conductive layer CL, and a second inorganic compound layer IOL2.

The first inorganic compound layer IOL1 and the second inorganic compound layer IOL2 may have a high refractive index to help improve a transmittance of the cathode CE. Each of the first and second inorganic compound layers IOL1 and IOL2 may have a refractive index equal to or greater than about 2. In an implementation, the first inorganic compound layer IOL1 and the second inorganic compound layer IOL2 may have the same or substantially the same refractive index.

In an implementation, the first inorganic compound layer IOL1 and the second inorganic compound layer IOL2 may include the same material. For example, each of the first inorganic compound layer IOL1 and the second inorganic compound layer IOL2 may be a tungsten oxide layer or a molybdenum oxide layer. In an implementation, each of the first inorganic compound layer IOL1 and the second inorganic compound layer IOL2 may have a thickness of, e.g., about 200 Å to about 400 Å. The transmittance of the cathode CE may be improved by multiple reflections and interference, which may occur when the light emitted from the organic light emitting layer EML passes through the first inorganic compound layer IOL1, the conductive layer CL, and the second inorganic compound layer IOL2.

The conductive layer CL may be a metal or metal-containing layer including, e.g., Li, Liq, Ca, LiF, Al, Mg, BaF, Ba, Ag, a compound thereof, or a mixture thereof. The metal layer may have a thickness of, e.g., about 50 Å to about 150 Å.

The electron control layer ECL may include, e.g., an electron transport material. In an implementation, the electron transport material may include, e.g., Alq3 (Tris(8-hydroxyquinolinato)aluminum), TPBi (1,3,5-Tri(1-phenyl-1H-benzo[d]imidazol-2-yl)phenyl), BCP (2,9-Dimethyl-4, 7-diphenyl-1,10-phenanthroline), Bphen (4,7-Diphenyl-1, 10-phenanthroline), TAZ (3-(4-Biphenylyl)-4-phenyl-5-tert-butylphenyl-1,2,4-triazole), NTAZ (4-(Naphthalen-1-yl)-3, 5-diphenyl-4H-1,2,4-triazole), tBu-PBD (2-(4-Biphenylyl)-5-(4-tert-butylphenyl)-1,3,4-oxadiazole), BAlq (Bis(2-methyl-8-quinolinolato-N1,O8)-(1,1'-Biphenyl-4-olato) aluminum), Bebq2 (berylliumbis(benzoquinolin-10-olate), AND (9,10-di(naphthalene-2-yl)anthracene), or a mixture thereof.

In an implementation, the electron control layer ECL may include, e.g., an ytterbium-doped electron transport material. In an implementation, the electron control layer ECL may include, e.g., about 1 wt % to about 10 wt % of ytterbium, based on a total weight (100 wt %) of the electron control layer ECL.

In an implementation, the electron control layer ECL may further include a hole blocking layer contacting the organic light emitting layer EML. In an implementation, the hole blocking layer may include at least one of, e.g., BCP (2,9-Dimethyl-4,7-diphenyl-1,10-phenanthroline) and Bphen (4,7-Diphenyl-1,10-phenanthroline).

The electron control layer ECL may include the ytterbium, and the electron control layer ECL may form a P-N junction with the first inorganic compound layer IOL1. The electron transport efficiency (which could be deteriorated due to the insulating property of the first inorganic compound layer IOL1) may be compensated by ytterbium included in the electron control layer ECL. Thus, the electron transport efficiency may be maintained and a light emitting efficiency may be improved in the organic light emitting diode OLED-1 that includes the electron control layer ECL having ytterbium and the cathode CE having the first inorganic compound layer IOL1, the conductive layer CL, and the second inorganic compound layer IOL2.

The light emitting efficiency of a Comparative Example and an Experimental Example will be described with reference to the following Table 1.

TABLE 1

|  | (Op. V) | (J) | (L) | (cd/A) | (lm/W) | EQE | x | y |
|---|---|---|---|---|---|---|---|---|
| Experimental Example | 10.5 | 5 | 1733 | 34.7 | 10.4 | 16.0 | 0.311 | 0.323 |
| Comparative Example | 13.1 | 5 | 1928 | 38.6 | 9.2 | 16.6 | 0.321 | 0.321 |

The light emitting efficiency is measured at a current density of about 5 mA/cm$^2$. In the Experimental Example and the Comparative Example, the organic light emitting diode has the same structure as that of the organic light emitting diode OLED-1 shown in FIG. 5A. The electron control layer according to the Experimental Example includes ytterbium, and the electron control layer according to the Comparative Example does not include ytterbium. The organic light emitting diode according to the Experimental Example has a driving voltage that is reduced when compared with the organic light emitting diode according to the Comparative Example. Thus, a power consumption of the organic light emitting display panel may be reduced.

Figure 6A:
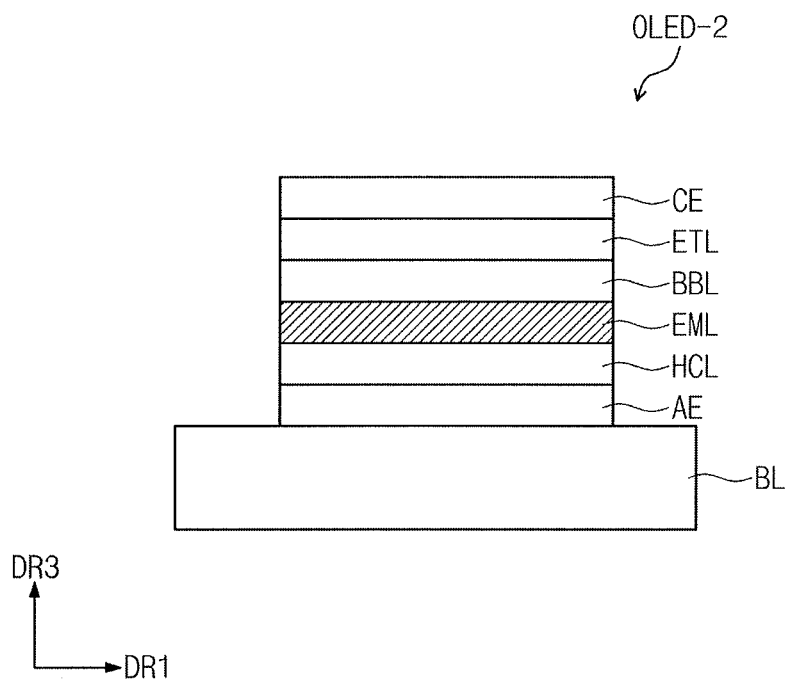
FIGS. 6A and 6B illustrate cross-sectional views showing an organic light emitting diode according to an exemplary embodiment.
Figure 6B:
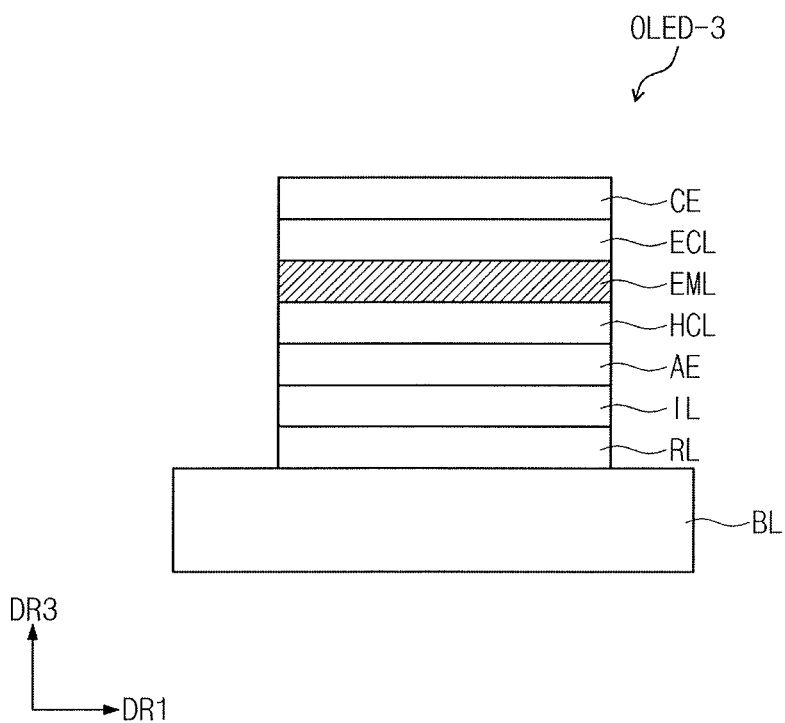

FIGS. 6A and 6B illustrate cross-sectional views showing organic light emitting diodes OLED-2 and OLED-3 according to an exemplary embodiment. Hereinafter, the organic light emitting diodes OLED-2 and OLED-3 will be described in detail with reference to FIGS. 6A and 6B. In FIGS. 6A and 6B, repeated detailed descriptions of the same elements as those in the organic light emitting diode OLED-1 shown in FIG. 5A may be omitted.

Referring to FIG. 6A, the organic light emitting diode OLED-2 may further include a diffusion blocking layer BBL. The diffusion blocking layer BBL may be disposed between the electron control layer ECL and the organic light emitting layer EML. The diffusion blocking layer BBL may include an electron transport material capable of improving the light emitting efficiency of the organic light emitting layer. For example, the diffusion blocking layer BBL may include at least one of a phosphine oxide-based compound, a pyrimidine-based compound, or a triazine-based compound, which may help improve a blue light emitting efficiency.

The diffusion blocking layer BBL may help reduce the possibility of and/or prevent ytterbium (included in the electron control layer ECL) from being diffused to the organic light emitting layer EML. If ytterbium were to be diffused to the organic light emitting layer EML, light efficiency could be deteriorated, driving voltage could be increased, and a lifespan of the diode could be shortened. When the organic light emitting diode OLED-2 further includes the diffusion blocking layer BBL, the undesirable effects mentioned above may be reduced and/or prevented.

Referring to FIG. 6B, the organic light emitting diode OLED-3 may further include a reflection layer RL. The reflection layer RL may be insulated from the anode AE. An insulating layer IL may be disposed between the reflection layer RL and the anode AE. In an implementation, the insulating layer IL may include an organic material or an inorganic material.

In an implementation, the anode AE may include a transparent conductive layer. The transparent conductive layer may include a transparent conductive oxide layer including a transparent conductive oxide material, e.g., indium tin oxide (ITO), indium zinc oxide (IZO), zinc oxide (ZnO), indium tin zinc oxide (ITZO), or the like. The anode AE may have a single-layer structure of the transparent conductive oxide layer.

The light emitted from the organic light emitting layer EML may be reflected by the reflection layer RL to travel to the third direction axis DR3. The reflection layer RL may be a metal layer. The reflection layer RL may be formed through a separate process or a process in which a pixel driving circuit operating the organic light emitting diode OLED-3 is formed. For example, the reflection layer RL may be disposed on the same layer as a control electrode GE1 (refer to FIG. 10) of a transistor.

In an implementation, the diffusion blocking layer BBL and the reflection layer RL described with reference to FIGS. 6A and 6B may be selectively applied to the organic light emitting diode according to an exemplary embodiment and organic light emitting diodes described below.

FIGS. 7A to 7G illustrate cross-sectional views showing organic light emitting diodes according to an exemplary embodiment. Hereinafter, the organic light emitting diodes OLED-4 to OLED-10 will be described in detail with reference to FIGS. 7A to 7G. In FIGS. 7A to 7G, repeated detailed descriptions of the same elements as those in the organic light emitting diodes OLED-1 to OLED-3 shown in FIGS. 5A, 6A, and 6B may be omitted.

A cathode CE of each of the organic light emitting diodes OLED-4 to OLED-9 shown in FIGS. 7A to 7G may have the same structure and function as those of the cathode CE of the organic light emitting diode OLED-1 shown in FIG. 5B. An electron control layer ECL or ECL2 contacting the cathode CE of each of the organic light emitting diodes OLED-4 to OLED-9 may have the same structure and function as those of the electron control layer ECL of the organic light emitting diode OLED-1 shown in FIG. 5A.

As shown in FIGS. 7A to 7G, the organic light emitting diodes OLED-4 to OLED-10 may include a plurality of light emitting layers EML1, EML2 and/or EML3. In an implementation, the organic light emitting diodes OLED-4 to OLED-7 may further include an electric charge generating layer disposed between the light emitting layers EML1 to EML3. In an implementation, the light emitting layers EML1 to EML3 of the organic light emitting diodes OLED-8 and OLED-9 may make contact with each other. In an implementation, the organic light emitting diode OLED-10 may further include an electric charge generating layer disposed between two light emitting layers of the light emitting layers EML1 to EML3. Two light emitting layers of the light emitting layers EML1 to EML3 may make contact with each other.

Figure 7A:
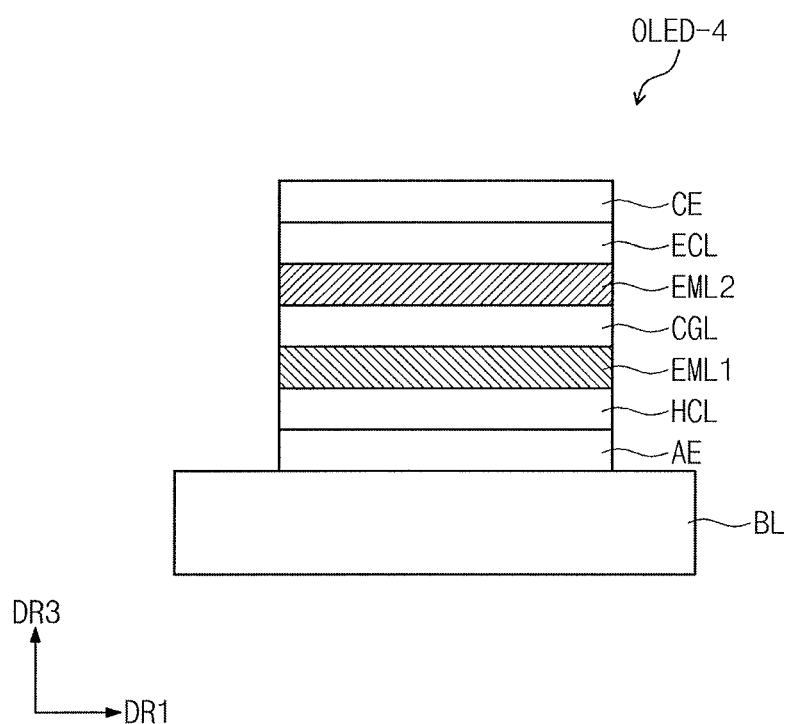
FIGS. 7A to 7G illustrate cross-sectional views showing an organic light emitting diode according to an exemplary embodiment.

Referring to FIG. 7A, the organic light emitting diode OLED-4 may include, e.g., an anode AE disposed on a base layer BL, a hole control layer HCL disposed on the anode AE, a first organic light emitting layer EML1 disposed on the hole control layer HCL, an electric charge generating layer CGL disposed on the first organic light emitting layer EML1, a second organic light emitting layer EML2 disposed on the electric charge generating layer CGL, an electron control layer ECL disposed on the second organic light emitting layer EML2, and a cathode CE disposed on the electron control layer ECL.

The first organic light emitting layer EML1 may generate a yellow light, and the second organic light emitting layer EML2 may generate a blue light. An organic material included in the first organic light emitting layer EML1 may include a suitable material that generates the yellow light, and an organic material included in the second organic light emitting layer EML2 may include a suitable material that generates the blue light. In an implementation, the yellow light and the blue light may generate a white light when mixed together. In an implementation, a suitable first color light generated by the first organic light emitting layer EML1 and a suitable second color light generated by the second organic light emitting layer EML2 may produce the white light when mixed together.

The electric charge generating layer CGL may include an electron generating layer having an n-type dopant (i.e., an organic layer doped with the n-type dopant and including an electron transport material) and a hole generating layer having a p-type dopant (i.e., an organic layer doped with the p-type dopant and including a hole transport material) and disposed above the electron generating layer in the third direction axis DR3.

Figure 7B:
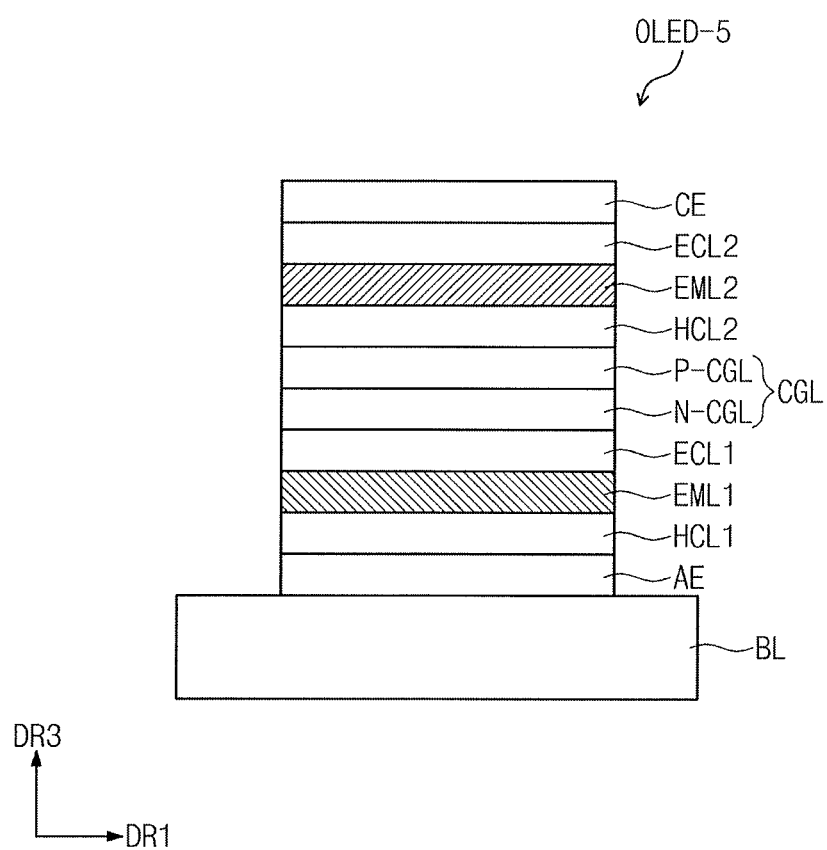

Referring to FIG. 7B, the organic light emitting diode OLED-5 may include, e.g., an anode AE, a first hole control layer HCL1, a first organic light emitting layer EML1, a first electron control layer ECL1, an electric charge generating layer CGL, a second hole control layer HCL2, a second organic light emitting layer EML2, a second electron control layer ECL2, and a cathode CE, which are sequentially stacked on a base layer BL. The electric charge generating layer CGL may include, e.g., an electron generating layer N-CGL and a hole generating layer P-CGL.

Figure 7C:
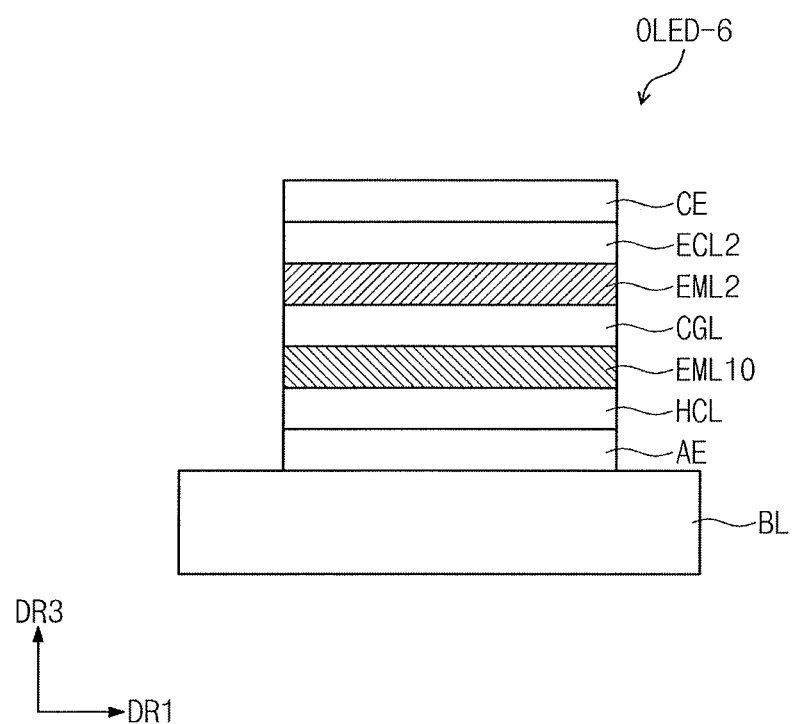

Referring to FIG. 7C, the organic light emitting diode OLED-6 may include, e.g., an anode AE, a hole control layer HCL, a first organic light emitting layer EML10, an electric charge generating layer CGL, a second organic light emitting layer EML2, an electron control layer ECL2, and a cathode CE, which are sequentially stacked on a base layer BL. Different from the first organic light emitting layer EML1 including one type of organic light emitting material in the organic light emitting diode OLED-4 shown in FIG. 7A, the first organic light emitting layer EML10 according to the present exemplary embodiment may include two types of organic light emitting materials, e.g., a mixture of the two types of organic light emitting materials.

The two types of organic light emitting materials may include a first organic light emitting material emitting a light having a first wavelength range, e.g., a green light having a wavelength of about 495 nm to about 570 nm, and a second organic light emitting material emitting a light having a second wavelength range different from the first wavelength range, e.g., a red light having a wavelength of about 620 nm to about 750 nm. The second organic light emitting layer EML2 may include a third organic light emitting material emitting a light having a third wavelength range that is different from the first and second wavelength ranges, e.g., a blue light having a wavelength of about 450 nm to about 495 nm.

Figure 7D:
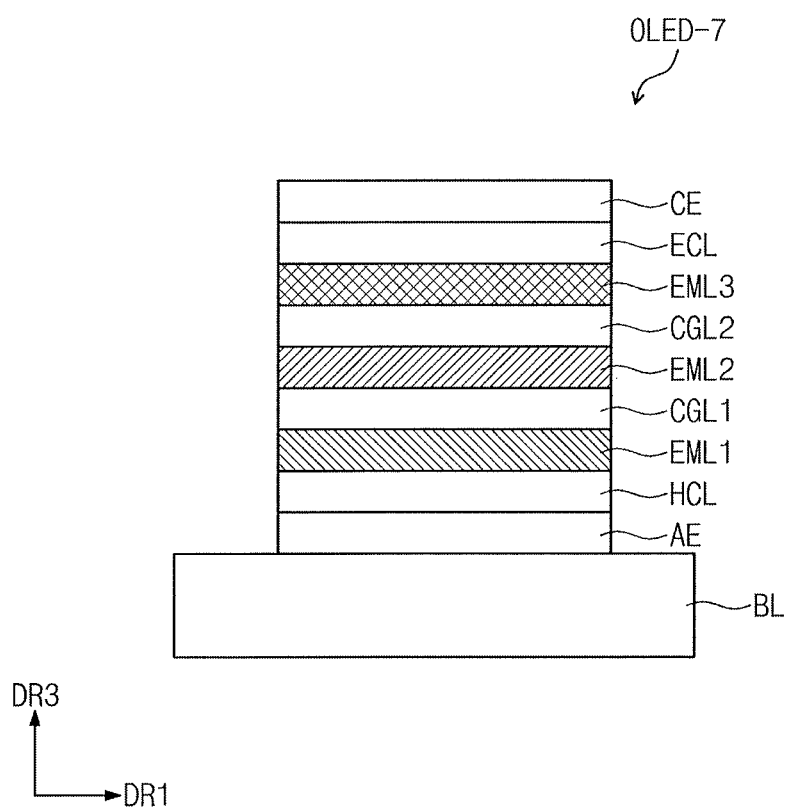

Referring to FIG. 7D, the organic light emitting diode OLED-7 may include, e.g., an anode AE, a hole control layer HCL, a first organic light emitting layer EML1, a first electric charge generating layer CGL1, a second organic light emitting layer EML2, a second electric charge generating layer CGL2, a third organic light emitting layer EML3, an electron control layer ECL, and a cathode CE, which are sequentially stacked on a base layer BL. The first organic light emitting layer EML1, the second organic light emitting layer EML2, and the third organic light emitting layer EML3 may include an organic light emitting material generating a red light, an organic light emitting material generating a green light, and an organic light emitting material generating a blue light, respectively.

Figure 7E:
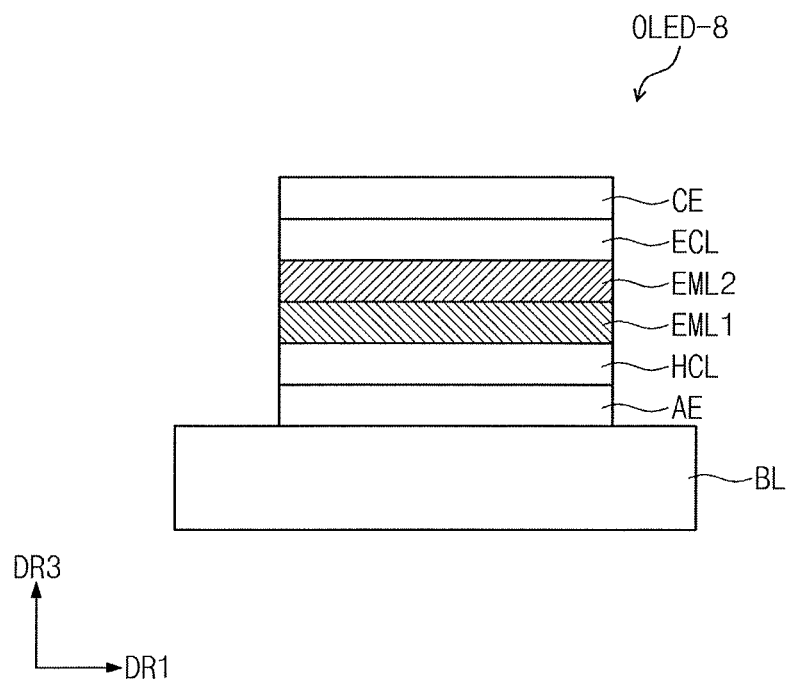

Referring to FIG. 7E, the organic light emitting diode OLED-8 may include, e.g., an anode AE, a hole control layer HCL, a first organic light emitting layer EML1, a second organic light emitting layer EML2, an electron control layer ECL, and a cathode CE, which are sequentially stacked on a base layer BL. The first organic light emitting layer EML1 may contact the second organic light emitting layer EML2. For example, the first organic light emitting layer EML1 may generate a yellow light, and the second organic light emitting layer EML2 may generate a blue light. Different from the organic light emitting diode OLED-6 shown in FIG. 7C, the electric charge generating layer CGL may be omitted in the organic light emitting diode OLED-8 according to the present exemplary embodiment.

Figure 7F:
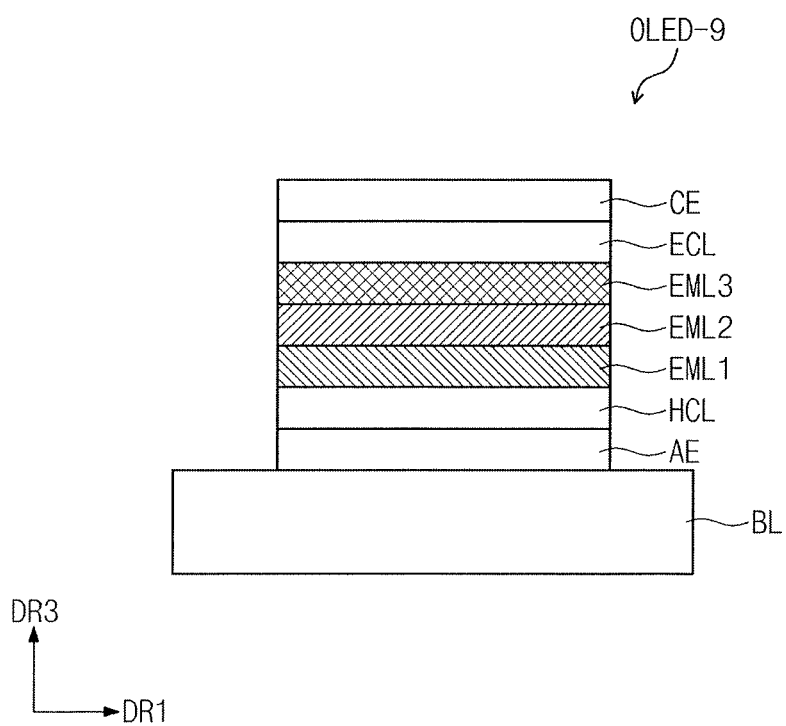

Referring to FIG. 7F, the organic light emitting diode OLED-9 may include, e.g., a first organic light emitting layer EML1, a second organic light emitting layer EML2, and a third organic light emitting layer EML3, which are sequentially stacked. Different from the organic light emitting diode OLED-7 shown in FIG. 7D, the electric charge generating layers CGL1 and CGL2 may be omitted from the organic light emitting diode OLED-9 according to the present exemplary embodiment.

Figure 7G:
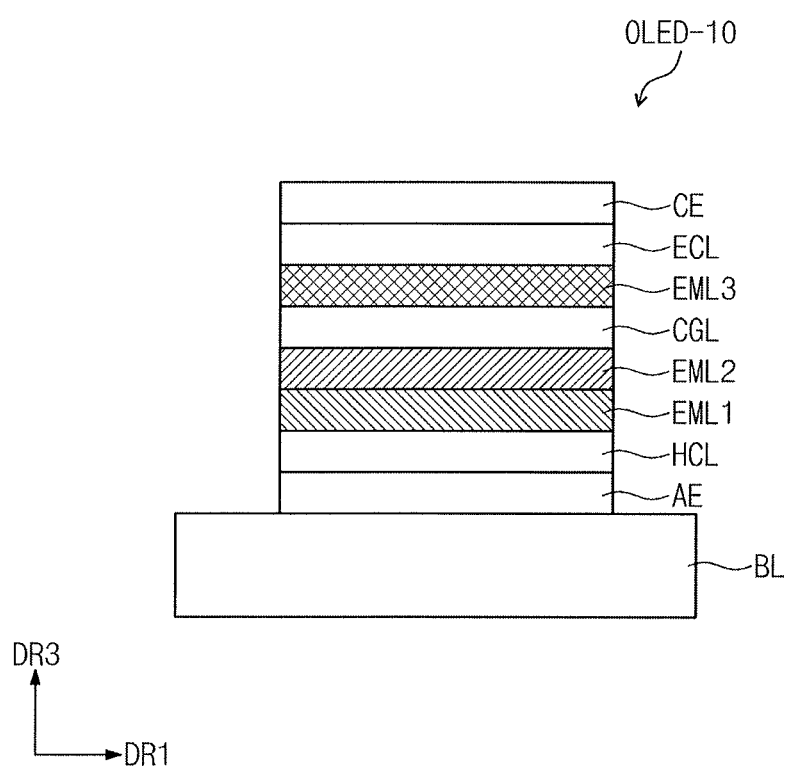

Referring to FIG. 7G, the organic light emitting diode OLED-10 may include, e.g., a first organic light emitting layer EML1, a second organic light emitting layer EML2, an electric charge generating layer CGL, and a third organic light emitting layer EML3, which are sequentially stacked. Different from the organic light emitting diode OLED-7 shown in FIG. 7D, the first electric charge generating layer CGL1 may be omitted from the organic light emitting diode OLED-10 according to the present exemplary embodiment. For example, the first organic light emitting layer EML1 and the second organic light emitting layer EML2 may generate a red light and a green light, respectively, and the third organic light emitting layer EML3 may generate a blue light.

Figure 8A:
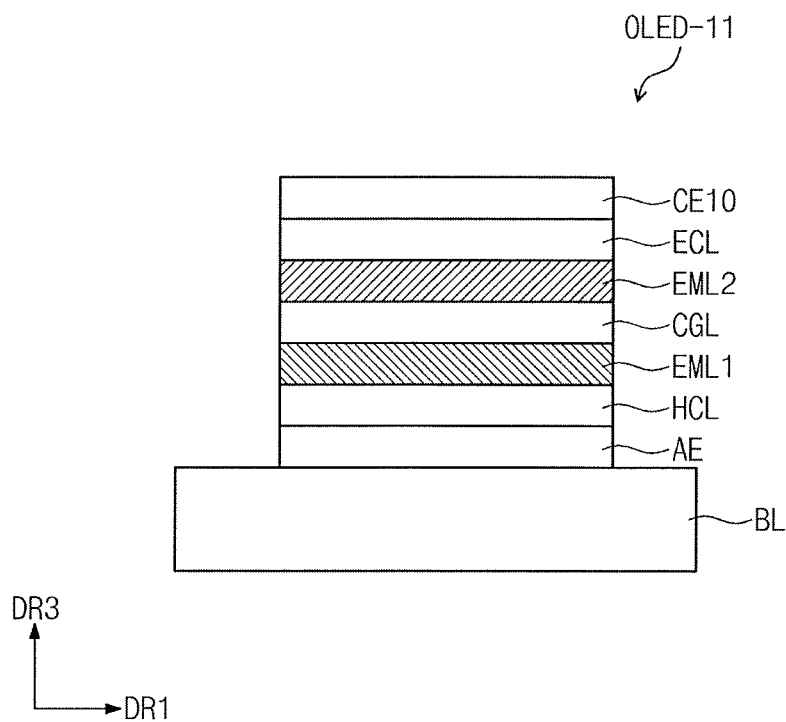
FIG. 8A illustrates a cross-sectional view showing an organic light emitting diode according to an exemplary embodiment.
Figure 8B:
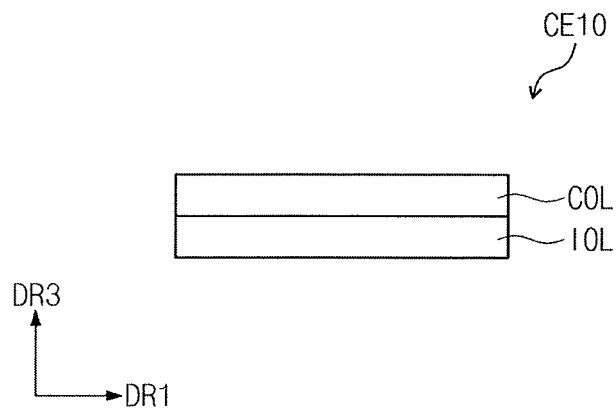
FIG. 8B illustrates a cross-sectional view showing a cathode according to an exemplary embodiment.

FIG. 8A illustrates a cross-sectional view showing an organic light emitting diode OLED-11 according to an exemplary embodiment. FIG. 8B illustrates a cross-sectional view showing a cathode CE10 according to an exemplary embodiment. Hereinafter, the organic light emitting diode OLED-11 will be described in detail with reference to FIGS. 8A and 8B. In FIGS. 8A and 8B, repeated detailed descriptions of the same elements as those in the organic light emitting diodes OLED-1 to OLED-9 shown in FIGS. 5A to 7F may be omitted.

The organic light emitting diode OLED-11 according to the present exemplary embodiment may include a cathode CE10 having a different structure from the cathode CE included in the organic light emitting diodes OLED-1 to OLED-9 shown in FIGS. 5A to 7F. In an implementation, the organic light emitting diode OLED-11 shown in FIG. 8A may have a structure similar to that of the organic light emitting diode OLED-4 shown in FIG. 7A.

The cathode CE10 according to the present exemplary embodiment may include, e.g., a transparent conductive oxide layer COL and an inorganic compound layer IOL disposed under the transparent conductive oxide layer COL in the third direction axis DR3, e.g., the inorganic compound layer IOL may be between the transparent conductive oxide layer COL and the electron control layer ECL. The inorganic compound layer IOL may help protect organic layers disposed under the cathode CE10 (e.g., on the base layer BL side of the inorganic compound layer IOL) during the manufacturing process of the transparent conductive oxide material COL. The inorganic compound layer IOL protecting the organic layers (e.g., an electron control layer ECL, a second organic light emitting layer EML2, or the like) may be formed on the electron control layer ECL and may protect against any damage or adverse effects that could result from a sputtering process used to manufacture the transparent conductive oxide layer COL The inorganic compound layer IOL may include, e.g., tungsten oxide or molybdenum oxide. The electron control layer ECL may include, e.g., an electron transport material doped with ytterbium, to help prevent an electron injection efficiency from being deteriorated due to the inorganic compound layer IOL.

Figure 9A:
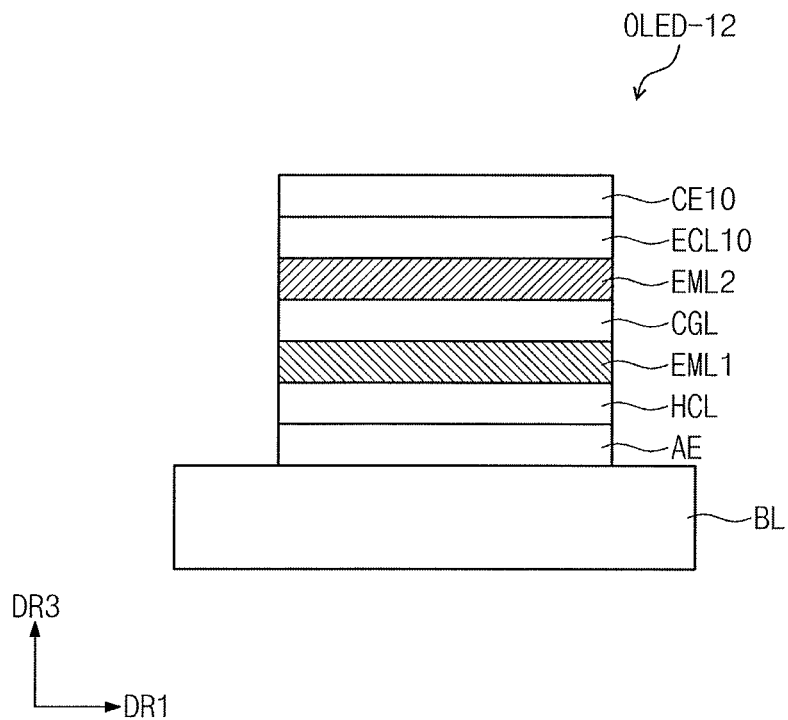
FIG. 9A illustrates a cross-sectional view showing an organic light emitting diode according to an exemplary embodiment.
Figure 9B:
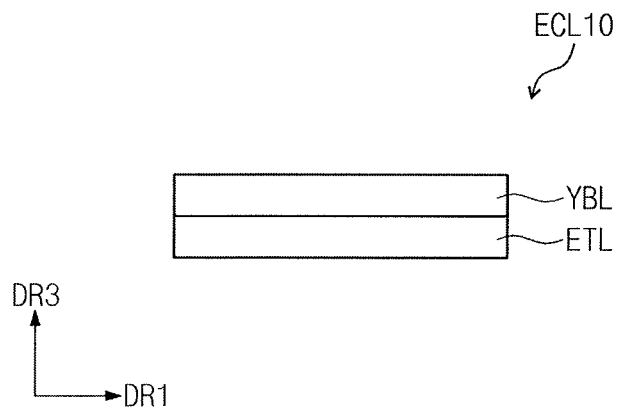
FIG. 9B illustrates a cross-sectional view showing an electron control layer according to an exemplary embodiment.

FIG. 9A illustrates a cross-sectional view showing an organic light emitting diode OLED-12 according to an exemplary embodiment. FIG. 9B illustrates a cross-sectional view showing an electron control layer ECL10 according to an exemplary embodiment. Hereinafter, the organic light emitting diode OLED-12 will be described in detail with reference to FIGS. 9A and 9B. In FIGS. 9A and 9B, repeated detailed descriptions of the same elements as those in the organic light emitting diodes OLED-1 to OLED-11 shown in FIGS. 5A to 8B may be omitted. In an implementation, the organic light emitting diode OLED-12 shown in FIG. 9A may have a similar stack structure to that of the organic light emitting diodes shown in FIGS. 7A and 8A.

In the present exemplary embodiment, the organic light emitting diode OLED-12 may include, e.g., an electron control layer ECL10 having a different structure from the electron control layers of the organic light emitting diodes OLED-1 to OLED-11 shown in FIGS. 5A to 8B. The organic light emitting diode OLED-12 according to the present exemplary embodiment may include, e.g., a cathode CE10 having the same structure as that of the cathode CE10 shown in FIG. 8B.

The electron control layer ECL10 according to the present embodiment may include, e.g., an ytterbium layer YBL and an electron transport layer ETL disposed under the ytterbium layer YBL (e.g., the electron transport layer ETL may be on a base layer BL facing side of the ytterbium layer YBL) in the third direction axis DR3. The electron transport layer ETL may include, e.g., an electron transport material. The ytterbium layer YBL may be a thin film containing ytterbium and may have a thickness of about 0.5 nm to about 100 nm.

The inorganic compound layer IOL may help protect organic layers disposed under the cathode CE10 (e.g., layers on a base layer BL facing side of the inorganic compound layer IOL). The ytterbium layer YBL may form a P-N junction with the inorganic compound layer IOL to help improve an electron injection efficiency.

Figure 10:
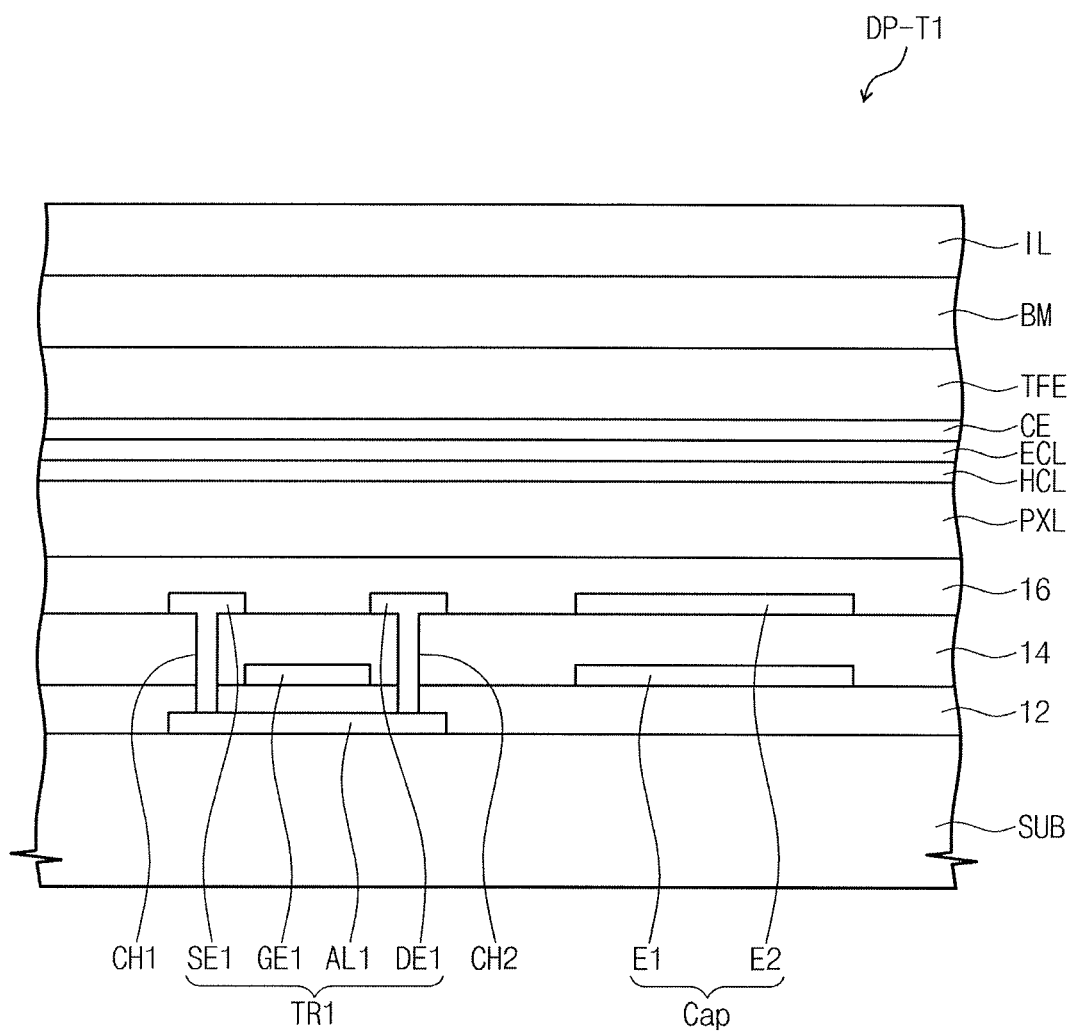
FIGS. 10 and 11 illustrate cross-sectional views showing an organic light emitting display panel according to an exemplary embodiment.
Figure 11:
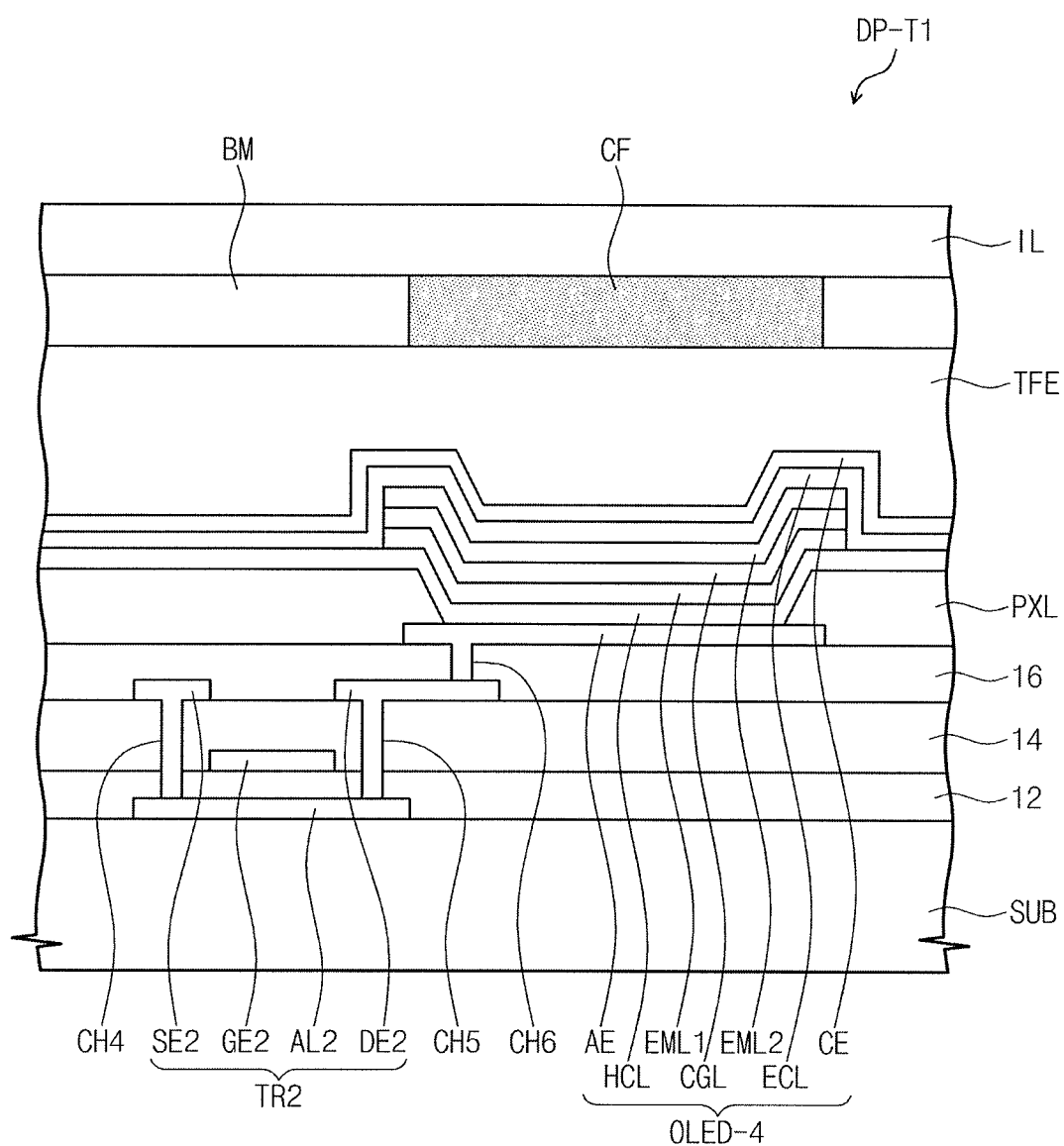

FIGS. 10 and 11 illustrate cross-sectional views showing an organic light emitting display panel DP-T1 according to an exemplary embodiment. FIGS. 10 and 11 illustrate cross-sectional views showing different areas of the sub-pixel SPXij shown in FIG. 2. FIG. 10 shows a cross-sectional view of areas corresponding to the first transistor TR1 and the capacitor Cap of the equivalent circuit shown in FIG. 2, and FIG. 11 shows a cross-sectional view of areas corresponding to the second transistor TR2 and the organic light emitting diode OLED of the equivalent circuit shown in FIG. 2.

Referring to FIGS. 10 and 11, the organic light emitting display panel DP-T1 may include, e.g., a base substrate SUB, insulating layers 12, 14, 16, and PXL, the sub-pixel SPXij, a thin film encapsulation layer TFE, a color filter CF, and a black matrix BM.

The base substrate SUB may include, e.g., a flexible plastic substrate, such as polyimide, a glass substrate, or a metal substrate. A semiconductor pattern AL1 of the first transistor TR1 (hereinafter, referred to as a first semiconductor pattern), a semiconductor pattern AL2 of the second transistor TR2 (hereinafter, referred to as a second semiconductor pattern) may be disposed on the base substrate SUB. The first semiconductor pattern AL1 and the second semiconductor pattern AL2 may include, e.g., amorphous silicon that is formed at a low temperature. The first semiconductor pattern AL1 and the second semiconductor pattern AL2 may further include, e.g., a metal oxide semiconductor. In an implementation, functional layers may be further disposed on one surface of the base substrate SUB. The functional layers may include, e.g., at least one of a barrier layer or a buffer layer. The first semiconductor pattern AL1 and the second semiconductor pattern AL2 may be disposed on the barrier layer or the buffer layer.

A first insulating layer 12 may be disposed on the base substrate SUB to cover the first and second semiconductor patterns AL1 and AL2. The first insulating layer 12 may include, e.g., an organic layer and/or an inorganic layer. For example, the first insulating layer 12 may include a plurality of inorganic thin films. The inorganic thin films may include, e.g., a silicon nitride layer and/or a silicon oxide layer.

A control electrode GE1 of the first transistor TR1 (hereinafter, referred to as a first control electrode) and a control electrode GE2 of the second transistor TR2 (hereinafter, referred to as a second control electrode) may be disposed on the first insulating layer 12. A first electrode E1 of the capacitor Cap may be disposed on the first insulating layer 12. The first control electrode GE1, the second control electrode GE2, and the first electrode E1 may be formed through the same photolithography process used to form the scan line SLi (refer to FIG. 2). For example, the first electrode E1 may include the same material as the scan line.

A second insulating layer 14 may be disposed on the first insulating layer 12 to cover the first control electrode GE1 and the second control electrode GE2. The second insulating layer 14 may include, e.g., an organic layer and/or an inorganic layer. For example, the second insulating layer 14 may include a plurality of inorganic thin films. The inorganic thin films may include a silicon nitride layer and a silicon oxide layer.

The source line DLj (refer to FIG. 2) and the power line PL (refer to FIG. 2) may be disposed on the second insulating layer 14. An input electrode SE1 (hereinafter, referred to as a first input electrode) and an output electrode DE1 (hereinafter, referred to as a first output electrode) of the first transistor TR1 may be disposed on the second insulating layer 14. An input electrode SE2 (hereinafter, referred to as a second input electrode) and an output electrode DE2 (hereinafter, referred to as a second output electrode) of the second transistor TR2 may be disposed on the second insulating layer 14. The first input electrode SE1 may be branched from the source line DLj. The second input electrode SE2 may be branched from the power line PL.

A second electrode E2 of the capacitor Cap may be disposed on the second insulating layer 14. The second electrode E2 may be formed through the same photolithography process used to form the source line DLj and the power line PL and may include the same material as the source line DLj and the power line PL.

The first input electrode SE1 and the first output electrode DE1 may be connected to the first semiconductor pattern AL1 through a first contact hole CH1 and the second contact hole CH2, respectively, which may be formed through the first insulating layer 12 and the second insulating layer 14. The first output electrode DE1 may be electrically connected to the first electrode E1. For example, the first output electrode DE1 may be connected to the first electrode E1 through a contact hole formed through the second insulating layer 14. The second input electrode SE2 and the second output electrode DE2 may be connected to the second semiconductor pattern AL2 through a fourth contact hole CH4 and a fifth contact hole CH5, respectively, which may be formed through the first insulating layer 12 and the second insulating layer 14. In an implementation, the first transistor TR1 and the second transistor TR2 may have a bottom gate structure.

A third insulating layer 16 may be disposed on the second insulating layer 14 to cover the first input electrode SE1, the first output electrode DE1, the second input electrode SE2, and the second output electrode DE2. The third insulating layer 16 may include, e.g., an organic layer and/or an inorganic layer. For example, the third insulating layer 16 may include an organic material to provide a flat surface. The third insulating layer 16 may correspond to the base layer BL shown in FIG. 5A.

A pixel definition layer PXL may be disposed on the third insulating layer 16. The pixel definition layer PXL may include an opening OP therethrough. The pixel definition layer PXL may serve as another insulating layer. The opening OP shown in FIG. 11 may correspond to openings OP-R, OP-G, and OP-B shown in FIG. 4A. An organic light emitting diode may be disposed on the third insulating layer 16. The organic light emitting diode may be one of the organic light emitting diodes described with reference to FIGS. 5A to 9B. FIG. 11 shows the organic light emitting diode OLED-4 of FIG. 7A as a representative example.

The anode AE may be connected to the second output electrode DE2 through a sixth contact hole CH6 formed through the third insulating layer 16. The opening OP of the pixel definition layer PXL may expose at least a portion of the anode AE. The hole control layer HCL may be commonly formed in the light emitting areas PXA-R, PXA-G, and PXA-B (refer to FIG. 4A) and the non-light emitting area NPXA (refer to FIG. 4A). The hole control layer HCL may be formed through a deposition process using an open mask. The first organic light emitting layer EML1, the electric charge generating layer GCL, the second organic light emitting layer EML2, and the electron control layer ECL may be sequentially formed on the hole control layer HCL using a fine metal mask. Then, the cathode CE may be commonly formed in the light emitting areas PXA-R, PXA-G, and PXA-B (refer to FIG. 4A) and the non-light emitting area NPXA (refer to FIG. 4A). The cathode CE may be formed by a deposition method or a sputtering method in accordance with the layer structure of the cathode CE.

The thin film encapsulation layer TFE may be disposed on the cathode CE. The thin film encapsulation layer TFE may include, e.g., a plurality of organic layers and a plurality of inorganic layers. The thin film encapsulation layer TFE may include, e.g., a lithium fluoride layer, an aluminum oxide layer, an organic monomer layer (e.g., including acrylate-based monomer), a silicon nitride layer, an organic monomer layer, and/or a silicon nitride layer, which are stacked one on another. The thin film encapsulation layer TFE may help protect the cathode CE from external moisture. In an implementation, an optical layer may be further disposed under the thin film encapsulation layer TFE to help improve a light extraction efficiency and to help reduce the possibility of and/or prevent external light from being reflected.

The black matrix BM and the color filter CF may be disposed on the thin film encapsulation layer TFE. The black matrix BM may be disposed to correspond the non-light emitting area NPXA of FIG. 4A, and the color filter CF may be disposed in a corresponding area of the light emitting areas PXA-R, PXA-G, and PXA-B. The organic light emitting diode OLED-4 may emit the white light and the color filter CF transmits a specific wavelength range of the white light. First, second, and third color filters having different colors may be disposed in the light emitting areas PXA-R, PXA-G, and PXA-B of FIG. 4A. Each of the first to third color filters may have one of red, green, and blue colors. Each of first, second, and third color filters may have the same color with a color of light generated from a corresponding organic light emitting diode. A gray color filter may be disposed in the white light emitting area PXA-W of the light emitting areas PXA-R, PXA-G, PXA-B, and PXA-W shown in FIG. 4E to help decrease a brightness of the white light. For example, the gray color filter my decrease a brightness of an incident light.

A protection layer IL may be disposed on the black matrix BM and the color filter CF. The protection layer IL may include, e.g., an organic layer or an inorganic layer.

Figure 12:
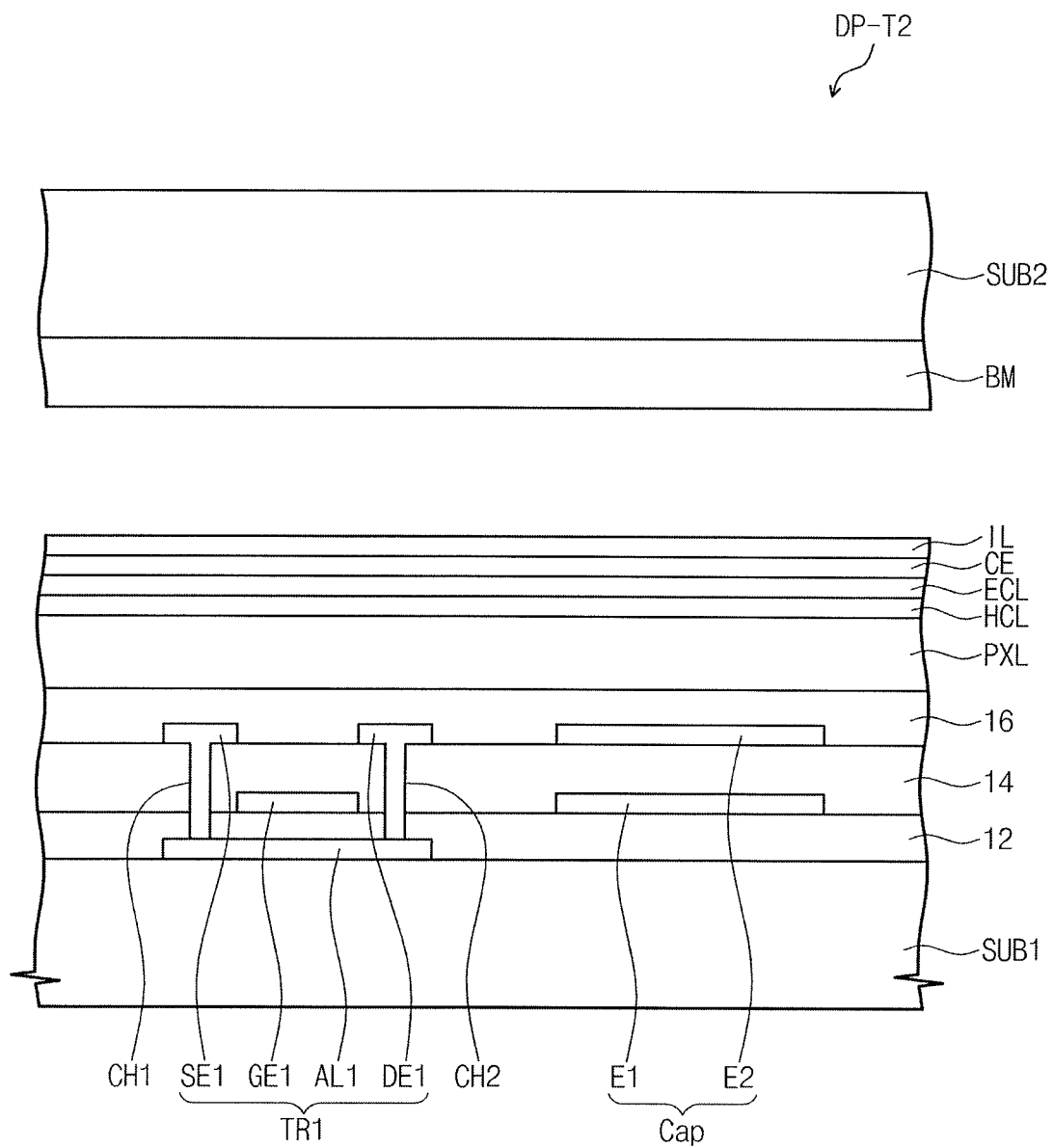
FIGS. 12 and 13 illustrate cross-sectional views showing an organic light emitting display panel according to an exemplary embodiment.
Figure 13:
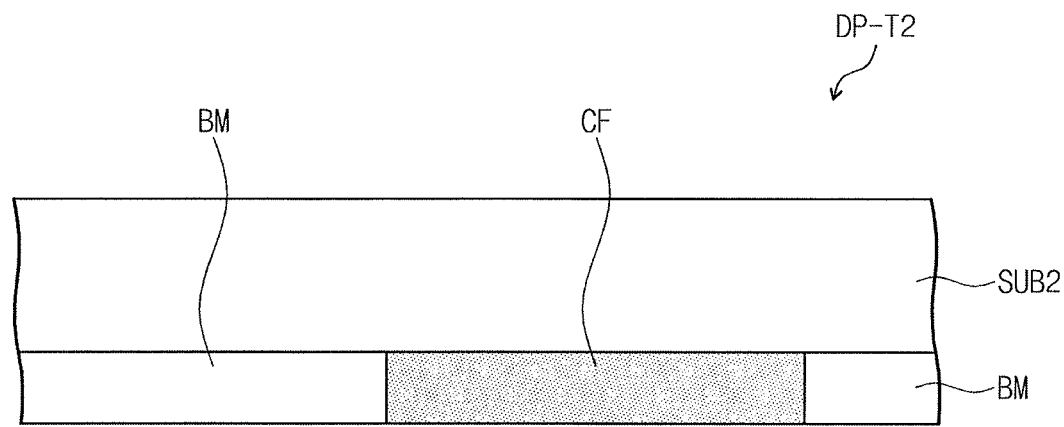
Figure 13:
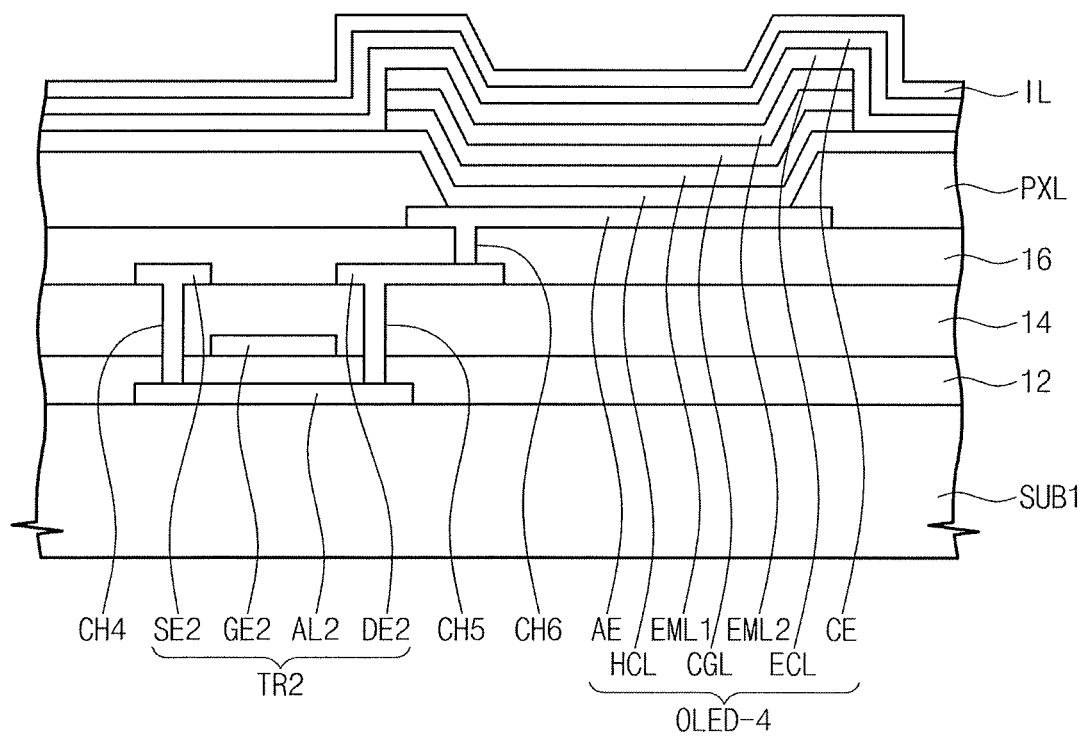

FIGS. 12 and 13 illustrate cross-sectional views showing an organic light emitting display panel DP-T2 according to an exemplary embodiment. Repeated detailed descriptions on the same elements as those in the organic light emitting display panel DP-T1 shown in FIGS. 10 and 11 may be omitted.

Referring to FIGS. 12 and 13, the organic light emitting display panel DP-T2 may include a sealing substrate SUB2 disposed to face a base substrate SUB1. The sealing substrate SUB2 may be spaced apart from the base substrate SUB1, and a black matrix BM and a color filter CF may be disposed on a lower surface of the sealing substrate SUB2. A moisture absorbent or an optical control layer may be further disposed between the sealing substrate SUB2 and a protection layer IL.

The embodiments may provide an organic light emitting diode having improved driving efficiency.

The embodiments may provide an organic light emitting diode having a reduced driving voltage.

According to the above, a transmittance of the cathode may be enhanced by including a first inorganic compound layer. In addition, the first inorganic compound layer may help protect the organic layer disposed thereunder during the process of forming the cathode.

The ytterbium of the electron control layer may help improve the electron injection efficiency. The first inorganic compound layer may be disposed between the conductive layer of the cathode and the organic light emitting layer, the electron control layer forms the P-N junction with the first inorganic compound layer, and thus the electron injection efficiency may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
   an anode disposed on a base layer;
   a first organic light emitting layer disposed on the anode;

a cathode disposed on the first organic light emitting layer; and an electron control layer disposed between the first organic light emitting layer and the cathode, the electron control layer including a layer including ytterbium, wherein the cathode includes:
   a first inorganic compound layer contacting the layer including ytterbium to define a P-N junction; and
   a conductive layer disposed on the first inorganic compound layer.

2. The organic light emitting diode as claimed in claim 1, wherein the first inorganic compound layer is a tungsten oxide layer or a molybdenum oxide layer.

3. The organic light emitting diode as claimed in claim 2, wherein:
   the layer including ytterbium comprises an electron transport material, and
   the electron transport material is doped with ytterbium.

4. The organic light emitting diode as claimed in claim 3, wherein the layer including ytterbium comprises about 1 wt % to about 10 wt % of ytterbium, based on a total weight of the electron control layer including ytterbium.

5. The organic light emitting diode as claimed in claim 3, wherein the conductive layer is a metal-containing layer.

6. The organic light emitting diode as claimed in claim 5, wherein the cathode further includes a second inorganic compound layer disposed on the conductive layer, the conductive layer being between the first and second inorganic compound layers, and the second inorganic compound layer having a same refractive index as the first inorganic compound layer.

7. The organic light emitting diode as claimed in claim 3, wherein the conductive layer is a transparent conductive oxide layer.

8. The organic light emitting diode as claimed in claim 2, wherein:
   the layer including ytterbium is an ytterbium layer, and
   the conductive layer is a transparent conductive oxide layer.

9. The organic light emitting diode as claimed in claim 1, further comprising a diffusion blocking layer disposed between the electron control layer and the first organic light emitting layer.

10. The organic light emitting diode as claimed in claim 1, further comprising a reflection layer disposed between the base layer and the anode, wherein the anode is a transparent conductive layer.

11. The organic light emitting diode as claimed in claim 1, wherein the anode includes at least one of a reflection layer or a transparent conductive oxide layer.

12. The organic light emitting diode as claimed in claim 1, further comprising a second organic light emitting layer disposed between the cathode and the first organic light emitting layer.

13. The organic light emitting diode as claimed in claim 12, wherein:
   the first organic light emitting layer includes a first organic light emitting material to generate a light having a first wavelength range,
   the second organic light emitting layer includes a second organic light emitting material to generate a light having a second wavelength range that is different from the first wavelength range,
   one light of the light having the first wavelength range and the light having the second wavelength range is a blue light, and
   the other light of the light having the first wavelength range and the light having the second wavelength range is a yellow light.

14. The organic light emitting diode as claimed in claim 12, wherein:
   the first organic light emitting layer includes a first organic light emitting material to generate a light having a first wavelength range, and
   the second organic light emitting layer includes:
      a second organic light emitting material to generate a light having a second wavelength range different from the first wavelength range, and
      a third organic light emitting material to generate a light having a third wavelength range different from the first wavelength range and the second wavelength range.

15. The organic light emitting diode as claimed in claim 12, further comprising an electric charge generating layer disposed between the first organic light emitting layer and the second organic light emitting layer.

16. The organic light emitting diode as claimed in claim 12, further comprising a third organic light emitting layer disposed between the cathode and the second organic light emitting layer.

17. The organic light emitting diode as claimed in claim 16, wherein:
   the first organic light emitting layer includes a first organic light emitting material to generate a light having a first wavelength range,
   the second organic light emitting layer includes a second organic light emitting material to generate a light having a second wavelength range different from the first wavelength range, and
   the third organic light emitting layer includes a third organic light emitting material to generate a light having a third wavelength range different from the first wavelength range and the second wavelength range.

18. The organic light emitting diode as claimed in claim 16, further comprising at least one of a first electric charge generating layer disposed between the first organic light emitting layer and the second organic light emitting layer and a second electric charge generating layer disposed between the second organic light emitting layer and the third organic light emitting layer.

19. An organic light emitting display panel, comprising:
   a base substrate;
   a circuit layer disposed on the base substrate, the circuit layer including a plurality of pixel driving circuits;
   a plurality of organic light emitting diodes disposed on the circuit layer, the plurality of organic light emitting diodes being electrically connected to the pixel driving circuits, respectively; and
   a plurality of color filters disposed on the organic light emitting diodes,
   wherein each of the organic light emitting diodes includes:
   an anode;
   a first organic light emitting layer disposed on the anode;
   a second organic light emitting layer disposed on the first organic light emitting layer;
   a cathode disposed on the second organic light emitting layer; and
   an electron control layer disposed between the second organic light emitting layer and the cathode, the electron control layer including ytterbium, wherein the cathode includes:
- a first inorganic compound layer directly contacting a portion of the electron control layer including the ytterbium to define a P-N junction; and
- a conductive layer disposed on the first inorganic compound layer.

20. The organic light emitting display panel as claimed in claim 19, further comprising a thin film encapsulation layer to encapsulate the organic light emitting diodes, wherein the color filters are disposed on the thin film encapsulation layer.

21. The organic light emitting display panel as claimed in claim 19, further comprising a sealing substrate facing the base substrate and sealing the organic light emitting diodes, wherein the color filters are disposed on a lower surface of the sealing substrate.

22. The organic light emitting display panel as claimed in claim 19, wherein each of the organic light emitting diodes generates a white light.

23. The organic light emitting display panel as claimed in claim 22, wherein the color filters include:
- a first color filter having a first color,
- a second color filter having a second color different from the first color, and
- a third color filter having a third color different from the first color and the second color.

24. The organic light emitting display panel as claimed in claim 23, wherein the color filters further include a gray color filter to decrease a brightness of an incident light.

25. The organic light emitting display panel as claimed in claim 19, further comprising a third organic light emitting layer disposed between the cathode and the first organic light emitting layer.

26. The organic light emitting display panel as claimed in claim 19, wherein the first inorganic compound layer is a tungsten oxide layer or a molybdenum oxide layer.

27. The organic light emitting display panel as claimed in claim 26, wherein:
- the electron control layer further includes an electron transport material, and
- the electron transport material is doped with the ytterbium.

28. The organic light emitting display panel as claimed in claim 27, wherein the electron control layer includes about 1 wt % to about 10 wt % of ytterbium, based on a total weight of the electron control layer.

29. The organic light emitting display panel as claimed in claim 27, wherein the conductive layer is a metal-containing layer.

30. The organic light emitting display panel as claimed in claim 29, wherein the cathode further includes a second inorganic compound layer disposed on the conductive layer, the second inorganic compound layer having a same refractive index as the first inorganic compound layer.

31. The organic light emitting display panel as claimed in claim 27, wherein the conductive layer is a transparent conductive oxide layer.

32. The organic light emitting display panel as claimed in claim 26, wherein:
- the electron control layer includes an ytterbium layer, and
- the conductive layer is a transparent conductive oxide layer.

33. An organic light emitting diode, comprising:
- an anode;
- an organic light emitting layer on the anode;
- an electron control layer on the organic light emitting layer, the electron control layer including ytterbium and an electron transport material; and
- a cathode on the electron control layer;
wherein the cathode includes:
- a first inorganic compound layer contacting the electron control layer to define a P-N junction; and
- a conductive layer on the first inorganic compound layer such that the first inorganic compound layer is between the electron control layer and the conductive layer.

34. The organic light emitting diode as claimed in claim 33, wherein the cathode further includes a second inorganic compound layer on the conductive layer such that the conductive layer is between the second inorganic compound layer and the first inorganic compound layer, the second inorganic compound layer having a same refractive index as the first inorganic compound layer.

35. The organic light emitting diode as claimed in claim 33, wherein the first inorganic compound layer includes tungsten oxide or molybdenum oxide.

36. The organic light emitting diode as claimed in claim 33, wherein the conductive layer includes a transparent conductive oxide.

37. The organic light emitting diode as claimed in claim 33, wherein the electron control layer includes about 1 wt % to about 10 wt % of ytterbium, based on a total weight of the electron control layer.

* * * * *